(12) United States Patent
Stolpman

(10) Patent No.: US 7,222,284 B2
(45) Date of Patent: May 22, 2007

(54) LOW-DENSITY PARITY-CHECK CODES FOR MULTIPLE CODE RATES

(75) Inventor: Victor J. Stolpman, Dallas, TX (US)

(73) Assignee: Nokia Corporation, Espoo (FI)

( * ) Notice: Subject to any disclaimer, the term of this patent is extended or adjusted under 35 U.S.C. 154(b) by 94 days.

(21) Appl. No.: 10/608,943

(22) Filed: Jun. 26, 2003

(65) Prior Publication Data

US 2004/0268205 A1 Dec. 30, 2004

(51) Int. Cl.
*H03M 13/35* (2006.01)
(52) U.S. Cl. .................................................. 714/774
(58) Field of Classification Search ................ 714/752, 714/774, 790
See application file for complete search history.

(56) References Cited

U.S. PATENT DOCUMENTS

| | | | |
|---|---|---|---|
| 6,633,856 B2 * | 10/2003 | Richardson et al. | 706/15 |
| 2002/0101915 A1 * | 8/2002 | Zhang et al. | 375/222 |
| 2003/0126551 A1 * | 7/2003 | Mantha et al. | 714/790 |
| 2004/0098659 A1 * | 5/2004 | Bjerke et al. | 714/776 |

OTHER PUBLICATIONS

Cox et al., "Subband Speech Coding and Matched Convolutional Coding for Mobile Radio Channels", IEEE Transactions on Signal Processing, vol. 39, No. 8, Aug. 1991, pp. 1717-1731.*
Kim et al., "Rate Compatible Punctured SCCC", IEEE 54th Vehicular Technology Conference, Oct. 2001, pp. 2399-2403.*
"Low-Density Parity-Check Codes", Gallager, Robert G., Cambridge, Mass., Jul. 1963, pp. 1-90.
"Optimal Puncturing Distributions for Rate-Compatible Low-Density Parity-Check Codes", Ha, Jeongseok et al., IEEE Transactions on Information Theory, vol. XX, No. Y, Aug. 2002, pp. 1-23.
"Optimal Puncturing of Irregular Low-Density Parity-Check Codes", Ha, Jeongseok et al., International Conference on Communications, Mar. 2003, pp. 1-5.
"the Capacity of Low-Density Parity-Check Codes Under Message-Passing Decoding", Richardson, Thomas J. et al., IEEE Transactions on Information theory, vol. 47, No. 2, Feb. 2001, pp. 599-618.
"Efficient Erasure Correcting Codes", Luby, Michael G. et al., IEEE Transactions on Information Theory, vol. 47, No. 2, Feb. 2001, pp. 569-584.
"On the Construction of Some Capacity-Approaching Coding Schemes", Chung, Sae-Young et al., Massachusetts Institute of Technology, Sep. 2000, pp. 1-241.

* cited by examiner

*Primary Examiner*—Stephen M. Baker
(74) *Attorney, Agent, or Firm*—Harrington & Smith, PC

(57) ABSTRACT

Puncture sequences $S_1$, $S_2$, etc. for code rates $R_1$, $R_2$, etc. less than a maximum code rate $R_{max}$ are defined subsets of a maximum rate puncture sequence $S_{max}$ that corresponds to the maximum code rate $R_{max}$. Each puncture sequence $S_i$ for a code rate $R_i$ is related to the puncture sequence $S_{i-1}$ of the previous code rate $R_{i-1}$, and preferably $S_1 \subseteq S_2 \subseteq \ldots \subseteq S_{max-1} \subseteq S_{max}$. The puncture sequences are groups of one or more memory elements, each of which is a variable degree, a variable node location, a check degree, or a check node location. A method for deriving such a puncture sequence for variable code rates is also disclosed.

38 Claims, 17 Drawing Sheets

LOW-DENSITY PARITY-CHECK CODES FOR MULTIPLE CODE RATES

FIELD OF THE INVENTION

The present invention relates to parity-check codes for encoding and decoding transmissions that may be at one of several transmission rates. The invention is particularly valuable when used with low-density parity-check (LDPC) codes, though it may be used with any block coding scheme. The present invention has application to wired and wireless communication systems.

BACKGROUND OF THE INVENTION

Low-density parity-check (LDPC) codes have recently been the subject of increased research interest for their enhanced performance on additive white Gaussian noise (AWGN) channels. As described by Shannon's Channel Coding Theorem, the best performance is achieved when using a code consisting off very long codewords. In practice, codeword size is limited in the interest of reducing complexity, buffering, and delays. LDPC codes are block codes, as opposed to trellis codes that are built on convolutional codes. LDPC codes constitute a large family of codes including turbo codes. Block codewords are generated by multiplying (modulo 2) binary information words with a binary matrix generator. LDPC codes uses a check parity matrix H, which is used for decoding. The term low density derives from the characteristic that the check parity matrix has a very low density of non-zero values, making it a relatively low complexity decoder while retaining good error protection properties.

The parity check matrix H measures (N−K)×N, wherein N is number of elements in a codeword and K is the number of information elements in the codeword. The matrix H is also termed the LDPC mother code. For the specific example of a binary alphabet, N is the number of bits in the codeword and K is the number of information bits contained in the codeword for transmission over a wireless or a wired communication network or system. The number of information elements is therefore less than the number of codeword elements, so K<N. FIGS. 1A and 1B graphically describe an LDPC code. The parity check matrix 20 of FIG. 1A is an example of a commonly used 512×4608 matrix, wherein each matrix column 22 corresponds to a codeword element (variable node of FIG. 1B) and each matrix row 24 corresponds to a parity check equation (check node of FIG. 1B). If each column 22 of the matrix H includes exactly the same number m of non-zero elements, and each row 24 of the matrix H includes exactly the same number k of non-zero elements, the matrix 20 represents what is termed a regular LDPC code. If the code allows for non-uniform counts of non-zero elements among the columns 22 and/or rows 24, it is termed an irregular LDPC code.

Irregular LDPC codes have been shown to significantly outperform regular LDPC codes, which has generated renewed interest in this coding system since its inception decades ago. The bipartite graph of FIG. 1B illustrates that each codeword element (variable nodes 26) is connected only to parity check equations (check nodes 28) and not directly to other codeword elements (and vice versa). Each connection, termed a variable edge 30 or a check edge 31 (each edge represented by a line in FIG. 1B), connects a variable node 26 to a check node 28 and represents a non-zero element in the parity check matrix H. The number of variable edges 30 connected to a particular variable node 26 is termed its degree, and the number of variable degrees 32 are shown corresponding to the number of variable edges 30 emanating from each variable node 26. Similarly, the number of check edges 31 connected to a particular check node 28 is termed its degree, and the number of check degrees 34 are shown corresponding to the number of check edges 31 emanating from each check node 31. Since the degree 32, 34 represents non-zero elements of the matrix H, the bipartite graph of FIG. 1B represents an irregular LDPC code matrix. The following discussion is directed toward irregular LDPC codes since they are more complex and potentially more useful, but may also be applied to regular LDPC codes with normal skill in the art.

Irregular codes can be designed for many different symmetric channels via density evolution and genetic hill-climbing algorithms (i.e., Differential Evolution) by adjusting variable edge polynomial $\lambda(x)$ and check edge polynomial $\rho(x)$, defined as:

$$\lambda(x) = \sum_{i=2}^{d_l} \lambda_i x^{i-1} \text{ and } \rho(x) = \sum_{i=2}^{d_r} \rho_i x^{i-1}$$

where $\{\lambda_2, \lambda_3, \ldots \lambda_{d_l}\}$ and $\{\rho_2, \rho_3, \ldots \rho_{d_r}\}$ are the edges distributions indicating the fraction of edges 30, 31 connected to variable and check nodes of degrees $\{2, 3, \ldots d_l\}$ and $\{2, 3, \ldots d_r\}$, respectively, out of the total number of edges. The edge distributions determine the asymptotic performance of the code ensemble, the code rate of the ensemble, and any code realizations derived from the distributions. The coding rate R for an LDPC code is R=K/(N−P), wherein P is the number of punctured elements, detailed below. Preferably, a transmission can be sent using a plurality of adaptive coding rates.

FIG. 2A is a prior art logical block diagram showing operation of a discrete communication system 36A using an LDPC coding scheme of multiple coding rates for its error control. An information source 38 outputs a K dimensional sequence of information bits s into a transmitter 39A, the transmitter including at least an encoder 40A, a modulation block 42, and storage 35A, 37A. An LDPC encoder 40 encodes the sequence s into an N dimensional codeword t by accessing a stored LDPC mothercode definition 37A and one of several stored puncture sequences 35A, one puncture sequence corresponding to one code rate. The codeword t is broken up into sub-vectors, which are then modulated and up-converted at a modulation block 42 and transmitted as a vector x of the sub-vectors over one or more channels 44. Additive white Gaussian noise n is added at the channel and/or from system hardware, so that the vector y=x+n is input into a receiver 45A. The receiver 45A includes at least a demodulation block 46, a decoder 48A, and memory storage for the same LDPC mother code 37A and the same puncture sequences 35A used by the transmitter 39A. Since x and n are uncorrelated and the modulation is memoryless, the received vector y can be demodulated symbol-by-symbol at a demodulating block 46, producing a hard decision vector $\hat{t}$ on the received information vector t. Probabilities of the decision being correct are also calculated at the demodulation block 46, and all this is input into an LDPC decoder 48A that iteratively decodes the entire received code block and outputs a decoded information vector $\hat{s}$ to an information sink 50.

The two prior art LDPC coding systems known to the inventor require significant non-volatile memory for each coding rate for a single mother code. In a first prior art approach, a different LDPC code is designated for each coding rate and channel (i.e., different code realizations from different $\lambda(x)$ and $\rho(x)$ corresponding to the desired code rates). This approach uses one LDPC code for each coding rate, and may increase substantially when the set of code rates is large and/or when code words are long. The storage requirements can render this approach prohibitive for adaptive coding and modulation schemes operating in slowly varying channels.

The second known prior art approach is to take a single LDPC code and puncture codeword elements using multiple puncturing sequences chosen at random using puncturing probabilities. This approach requires storage of multiple puncturing sequences, one for each code rate, which may become prohibitive for a large set of coding rates and/or long codeword lengths. FIG. 3 illustrates the storage requirements of such a system. To support all possible code rates of a punctured LDPC mother code, the system would need to store N–K different puncture sequences 52. Each horizontal line represents a unique stored puncture sequence 52, indexed as $S_1, S_2, S_3, \ldots S_{N-K}$, that applies to a specific coding rate $R_1, R_2, R_3, \ldots R_{N-K}$. The total memory requirement for such a system is $$\sum_{i=1}^{N-K} i$$

uncompressed memory elements.

Besides substantial amounts of memory required to store prior art puncturing sequences for various coding rates, the determination of the puncturing sequences is itself computationally intensive. Like the coding systems themselves, the prior art reveals at least two distinct methods for designing a puncture sequence. The first method is based on linear programming to determine puncturing probabilities that maximize the puncturing fraction:

$$p^{(0)} = \sum_{j=2}^{d_l} \lambda'_j \pi_j^{(0)}$$

for a given signal to noise ratio (SNR, or bit/symbol energy to noise power spectral density $E_b/N_0$) threshold, wherein $\lambda'_j$ represents the fraction of variable nodes 26 of degree j. The other prior art approach to puncture sequence design is based on differential evaluation based on Density Evolution, which is somewhat more complex than the linear programming method described immediately above with near identical results. Each of these approaches for designing the puncture sequences are very computationally expensive, and their resulting sequences themselves require so much storage as to be potentially prohibitive for an adaptive coding system.

Thus, each of the known prior art approaches require substantial amounts of storage to implement a wide variety of code rates. It is anticipated that neither of the prior art approaches will be suitable for future communication systems that employ adaptive coding and implement a wide range of coding rates. Additionally, each of the two noted prior art approaches in designing puncture sequences are computationally intensive. What is needed in the art is a more elegant set of puncture codes that will not require so much storage as to make their use prohibitive in the adaptive coding rate communications systems that represent what may be a large portion of future communications. Ideally, such an elegant set of puncture codes would also submit to a more straightforward method of determining them, so that more sets of such codes could be developed and optimized for different applications to close further on the theoretical Shannon capacity limit.

SUMMARY OF THE INVENTION

The present invention is directed to a coding/decoding system that is more compatible with adaptive coding communication systems, especially by requiring less memory. The present invention may be embodied in a communication unit such as a transmitter, in a receiver, or in a transceiver that may puncture codewords at any of several code rates, puncture meaning to remove or to add an element to the codeword in accordance with known practice. In accordance with one aspect of the present invention, the communication unit for a multiple code rate communication system includes a codeword. The codeword defines N codeword elements, K information elements, and P punctured elements. The particular code rate is $R=K/(N-P)$. The transmitter or receiver further includes a first storage location for storing an error reduction code mother code definition. Preferably, this is an LDPC mother code definition such as a parity check matrix of dimensions of (N–K) rows and N columns.

The communication unit further includes a second storage location for storing a maximum puncture sequence $S_{max}$. $S_{max}$ is the puncture sequence for a maximum code rate $R_{max}$, and preferably $S_{max}=S_{N-K}$. $S_{max}$ itself includes at least one subset $S_1$ that is a puncture sequence for a minimum code rate $R_1$. $S_1$, and preferably all other puncture sequences corresponding to code rates less than $R_{max}$, are each a subset of $S_{max}$. This reduces the memory requirements as compared to prior art puncture sequencing. Preferably, $S_1 \subseteq S_2 \subseteq \ldots \subseteq S_{max-1} \subseteq S_{max}$. Preferably, $S_{max}$ is a plurality of memory elements, each of which is a variable degree. Alternatively, the memory elements may be variable node locations, check node locations, or check degrees.

Another aspect of the present invention is a computer program embodied on a computer readable medium for determining a puncture sequence for a codeword. The computer program includes a first storage location for storing a LDPC mother code definition. It also includes a second storage location for storing a plurality of memory elements $M_{all}$ that in combination comprise a maximum rate puncture sequence $S_{max}$ that corresponds to a maximum code rate $R_{max}$. The computer program further includes a first set of computer instructions for reading a first subset of memory elements $M_{set1}$. The number of the first subset of memory elements is less than the number of the plurality of memory elements that comprise the maximum rate puncture sequence. The specific memory elements $M_{set1}$ comprises a puncturing sequence $S_1$ that corresponds to a code rate $R_1$ that is less than $R_{max}$.

Another aspect of the present invention is a method for determining a puncture sequence S for an ensemble of low-density parity-check (LDPC) codes. The method includes selecting at least one design criteria for an ensemble of LDPC codes and a stop criteria. A mean input LLR values, $m_{u_0}$, is then calculated that achieves the design criteria on the ensemble of codes. A variable degree j is selected, within the design criteria, for puncturing that requires one of a smallest mean input LLR value or a smallest decoding complexity. The variable degree is then appended to the puncturing sequence, and the puncturing probability is adjusted for the punctured variable degree, $\pi_j^{(0)}$. The above actions, beginning with calculating the mean input LLR value, until the stop criteria is reached. Various design criteria and stop criteria are described, as well as considerations in determining the puncturing probability.

DETAILED DESCRIPTION OF THE INVENTION

Figure 2A:
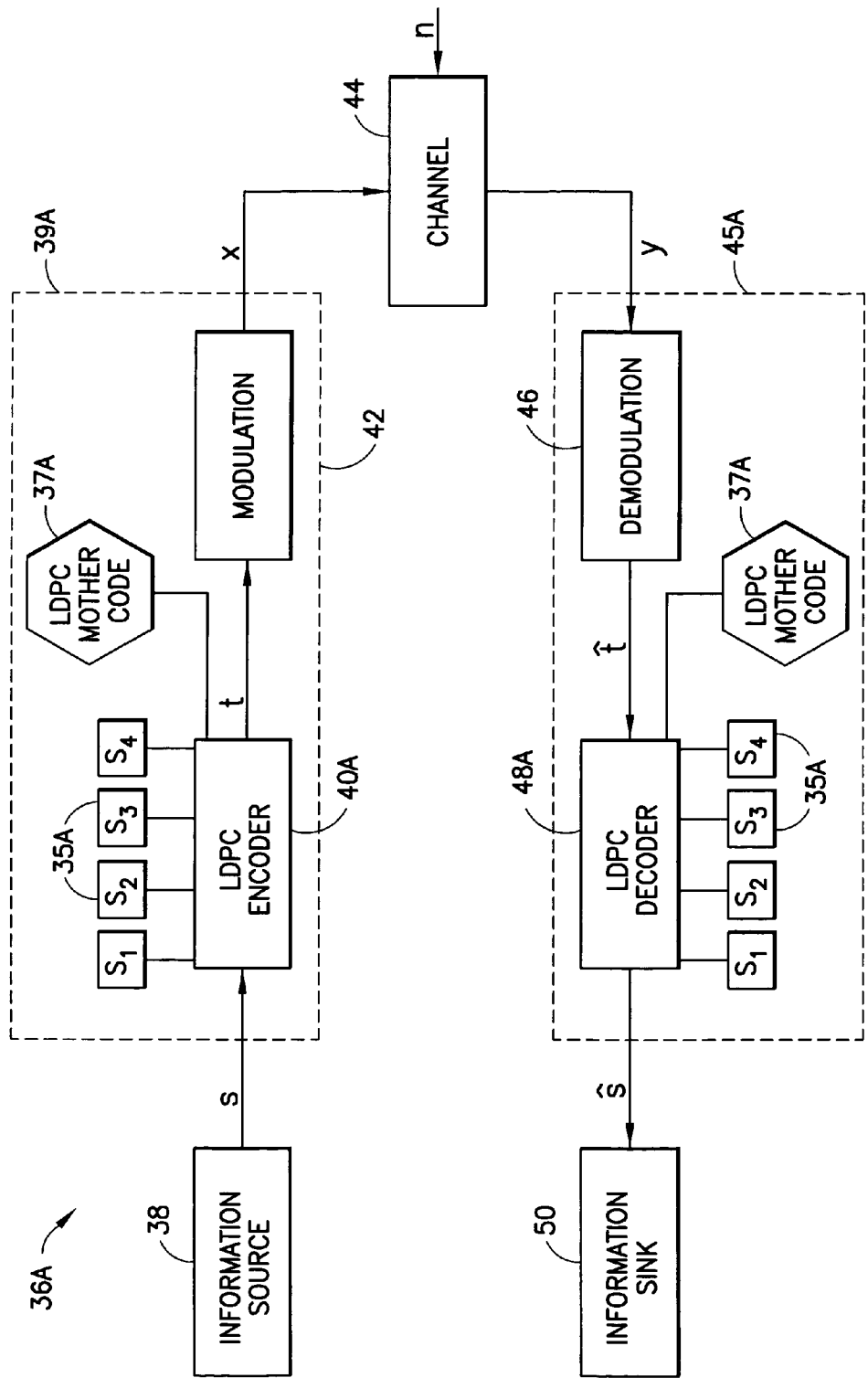
FIG. 2A is a logical block diagram of a communication system of the prior art.

The present invention enables an LDPC encoder or decoder to use significantly less memory than prior art approaches by using a single puncture sequence $S_{N-K}$ for the maximum rate $R_{max}$, and forcing all puncture sequences $S_x$ for lesser rates $R_x$ to be a subset of the maximum rate puncture sequence $S_{N-K}$. Consider the communication system 36B of FIG. 2B, which is similar in many respects to that of FIG. 2A. The communication system 36B would like to communicate K bits of information per codeword using different code rates by puncturing the code words encoded from a single LDPC mother code definition of rate K/N where N is the length of the code words (i.e. number of elements in the each code word). The encoder 40B selects and punctures P codeword bits by removing these bits from the codeword elements that are to be sent through the channel 44. Thus, the puncture count, $P \in \{0, 1, \ldots, N-K\}$, determines the effective code rate of K/(N-P). The encoder 40B accesses memory that stores a LDPC mother code definition 37B and a maximum code rate puncture sequence $S_{max}$ 35B. $S_{max}$ corresponds to the maximum code rate $R_{max}$. For lesser code rates, subsets of $S_{max}$ determine the puncture sequence, so all of the puncture sequence information is stored in $S_{max}$ 35B.

At the receive end of the communication, the demodulation block 46 receives the distorted codeword without the P punctured bits that were never sent. Before decoding the codeword, the decoder 48B reconstructs the entire codeword by inserting values that do not bias the decoding (i.e. neutral with respect of decoding a zero or a one) of punctured bits back into the P punctured locations (e.g. zero if log-likelihood-ratio values are used as inputs into the sum-product decoder). The decoder 48B accesses memory that stores the same LDPC mother code 37B and the same maximum code rate puncture sequence $S_{max}$ 35B as the transmitter 39B. Then, the decoder 48B decodes the reconstructed codeword attempting to correct any errors due to the communication channel 44 along with the punctured bits. Both the transmitter and the receiver store the LDPC mother code 37B and a puncturing sequence 35B that can be used, in whole or in part, for any of the different code rates.

Figure 1A:
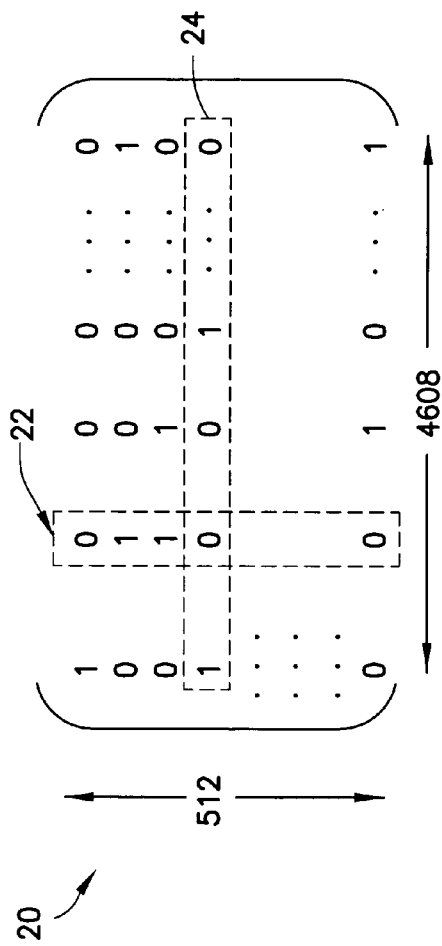
FIG. 1A is a matrix of an illustrative Low-Density Parity-Check mother code.
Figure 1B:
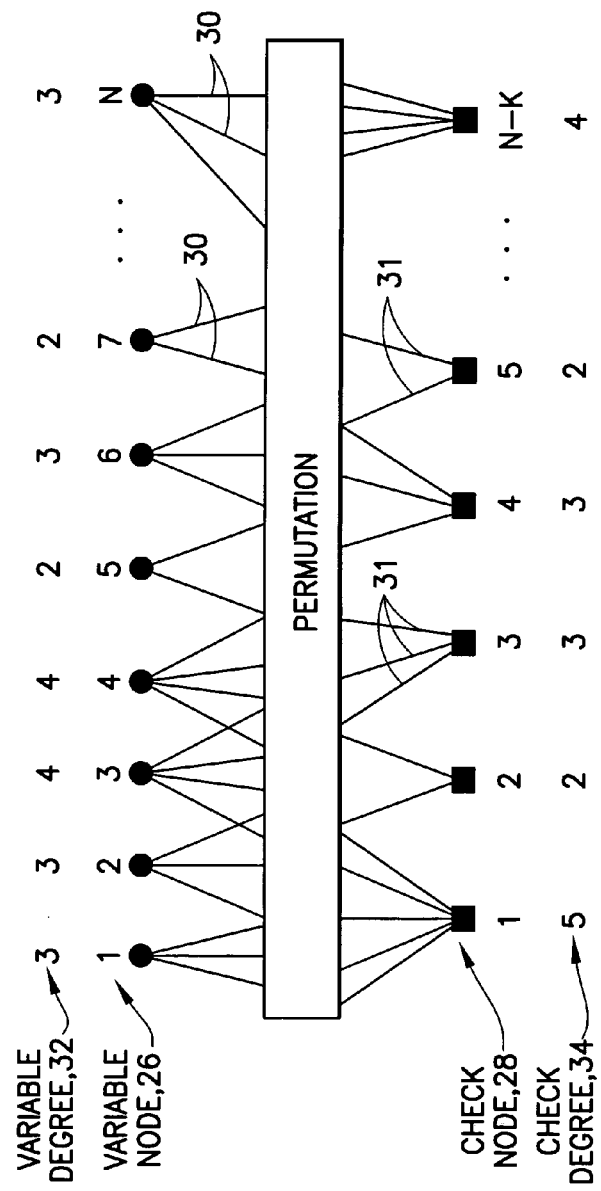
FIG. 1B is a bipartite graph depicting connections between variable and check nodes.
Figure 4:
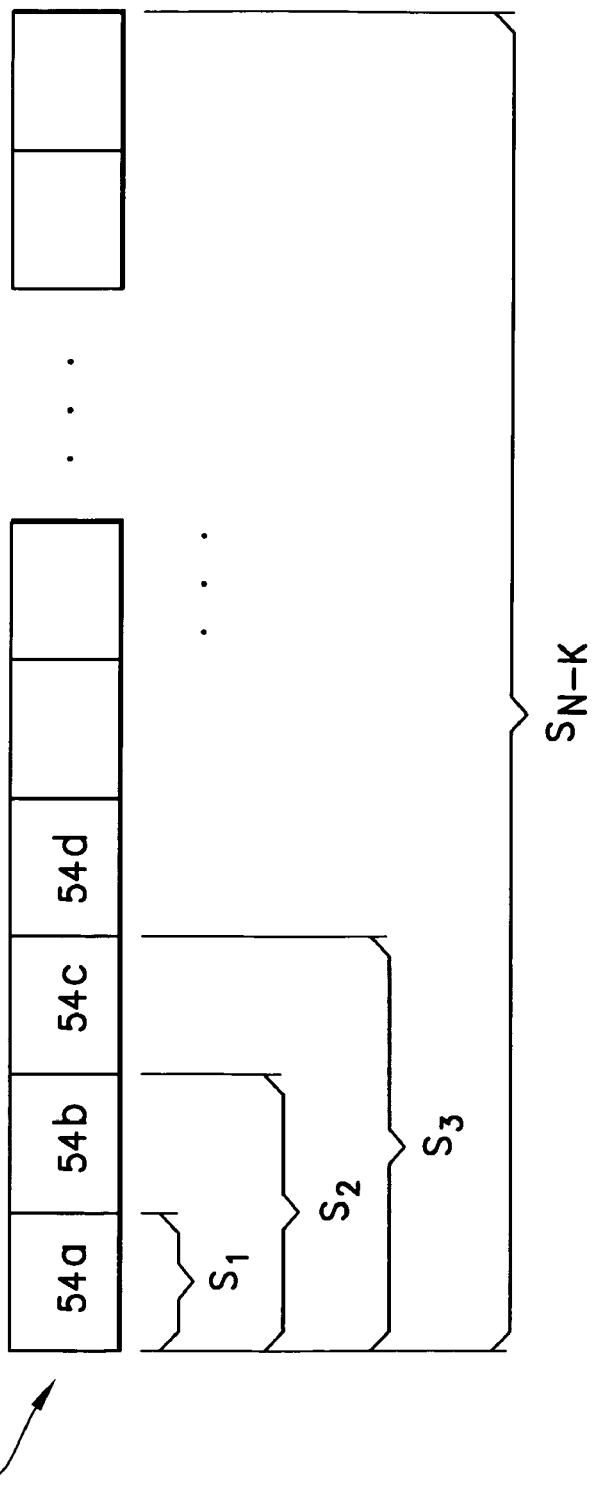
FIG. 4 is similar to FIG. 3, but according to a preferred embodiment of the present invention.
Figure 5:
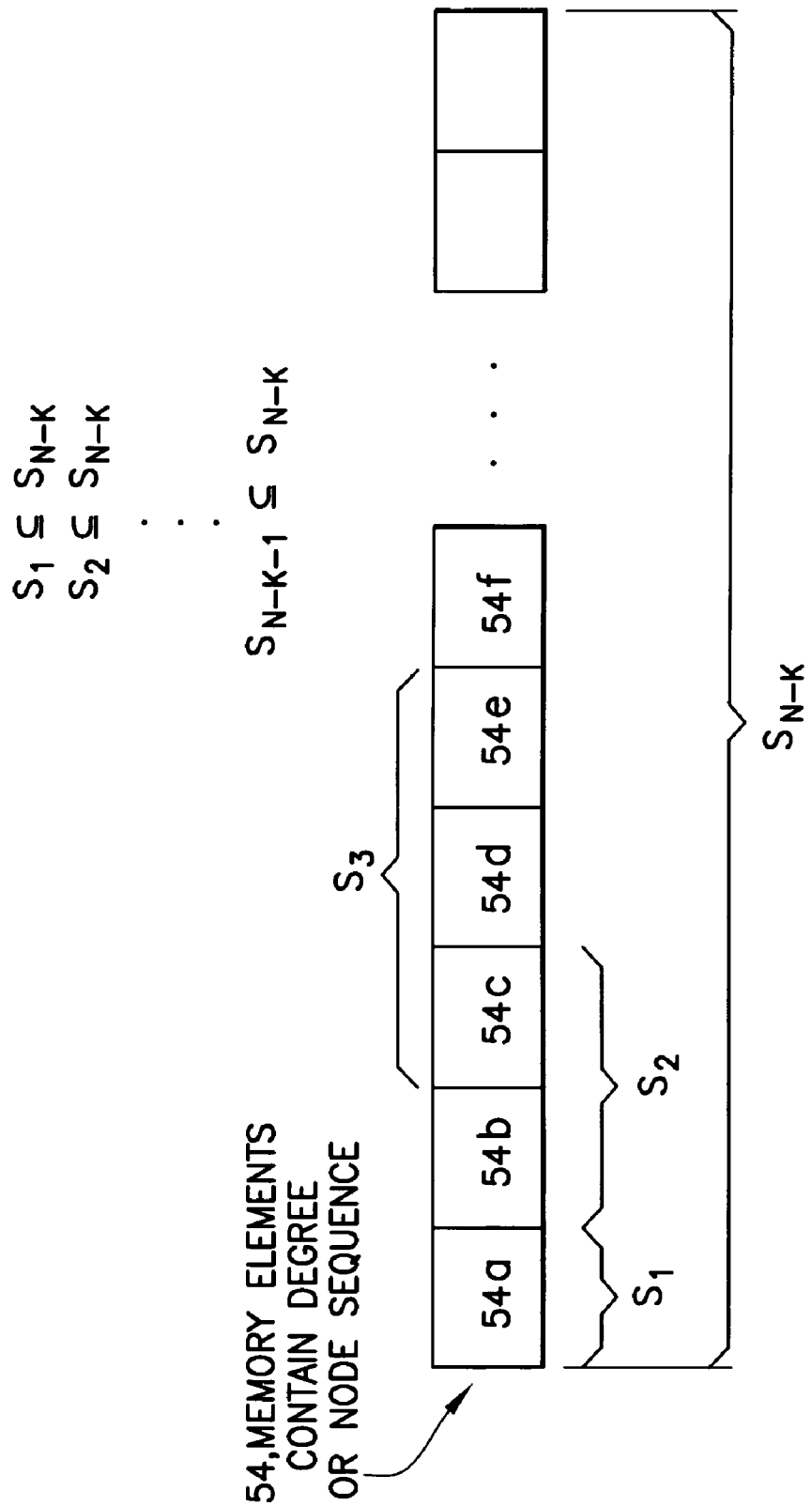
FIG. 5 is similar to FIG. 4, but according to an alternative embodiment of the present invention.

Two embodiments are shown graphically at FIGS. 4 and 5, respectively. In the embodiment of FIG. 4, the maximum puncture sequence $S_{max}=S_{N-K}$ is represented by a relatively long sequence of memory elements 54, which are depicted as sequential but need not be stored in physically adjacent areas of a volatile memory. A first puncture sequence $S_1$ is stored at a first memory element 54a, which is the first memory element of the sequence of memory elements that comprise the maximum rate puncture sequence $S_{N-K}$. In terms of the matrix H of FIG. 1A, the first puncture sequence may represent either the non-zero element locations (variable node locations) or the number of non-zero elements (variable degree) of the first column. A second puncture sequence $S_2$ is stored at a first 54a and second 54b memory elements, which are the first two memory elements of the sequence of memory elements that comprise the maximum rate puncture sequence $S_{N-K}$. In terms of the matrix H of FIG. 1A, the second puncture sequence may represent either the non-zero element locations (variable node locations) or the number of non-zero elements (variable degree) of the first and second columns. By this arrangement, $S_1$ is a subset of $S_2$, which is a subset of $S_3$, etc., and all are subsets of $S_{N-K}$. This relation is written as $S_1 \subseteq S_2 \subseteq S_3 \subseteq \ldots \subseteq S_{N-K}$. Both the transmitter and receiver store the same predetermined sequence for a given LDPC mother code in memory. For the code rate K/(N-P), each terminal would then use the first P elements of the same $S_{N-K}$ puncture sequence for the mother codeword.

The puncture sequence $S_{max}$ may or may not be the entire matrix H [of dimensions (N-K)×N] because the maximum practical puncture sequence $S_{N-K}$ may not be available. For example, assume a codeword length N=3000, K=1000 information elements, and P=number of punctured elements. Without puncturing, the rate is K/N=1000/3000=0.33. With puncturing, the code rate varies by R=K/(N-P), and depends upon how many elements are punctured. For P=500, the rate is increased only to R=1000/2500=0.4. For P=1000, the rate is R=0.5. For P=(N-K)=2000, the rate is K/K=1. Further puncturing beyond P=2000 is not desirable because P=(N-K) already results in the maximum possible coding rate. A transmitter or receiver may artificially bound the maximum coding rate to less than R=1 to ensure that some repetitive transmission always occurs to ensure accuracy.

As in FIG. 4, the embodiment of FIG. 5 shows the maximum puncture sequence $S_{N-K}$ is represented by a relatively long sequence of memory elements 54. The first puncture sequence $S_1$ is stored at a first memory element 54*a* as in FIG. 4. The second puncture sequence $S_2$ is stored at the second 54*b* and third 54*c* memory that comprise the maximum rate puncture sequence $S_{N-K}$. The third puncture sequence $S_3$ is stored at the third 54*c*, fourth 54*d* and fifth 54*e* memory elements that comprise the maximum rate puncture sequence $S_{N-K}$, and so forth. In the embodiment of FIG. 5, each of the puncture sequences $S_x$ includes one and only one memory element that is not a memory element in the puncture sequence $S_{x+1}$ corresponding to the next faster rate $R_{x+1}$. The embodiment of FIG. 5 may also include either an algorithm to determine reference points or an additional sequence [no longer than (N−K) ] that stores the reference points (e.g. starting or ending locations such as 54*c* and 54*e* for $S_3$) of all the subsets $S_x$, one for each code rate (i.e. puncture count P). Another embodiment arranges the subsets $S_x$ to straddle the serial sequence endpoints to form contiguous subsets of a circular sequence.

For each code rate supported by the system 36B, both the encoder 40B in the transmitter and the decoder 48B in the receiver must know the puncture locations within the codeword beforehand. In this invention, the locations of these P punctures are preferably contiguous subsets selected from a single puncture sequence $S_{N-K}$ of length (N−K). Either variable degrees 32 or variable node locations 26 in the codeword compose the individual elements of the puncture sequence $S_{N-K}$. Indeed, the sequence's length may be shorter than (N−K) if the communication system 36 strictly bounds the maximum code rate $R_{max}$ below one.

For a given variable degree sequence, all node 26 permutations within each individual degree 32 are just different node realizations of that degree sequence. In implementation, a communication system 36 would preferably use a single sequence of variable nodes 26 and not variable degrees 32. However, determining variable node 26 permutations within each variable degree 32 is just one embodiment of the degree sequence.

Figure 6:
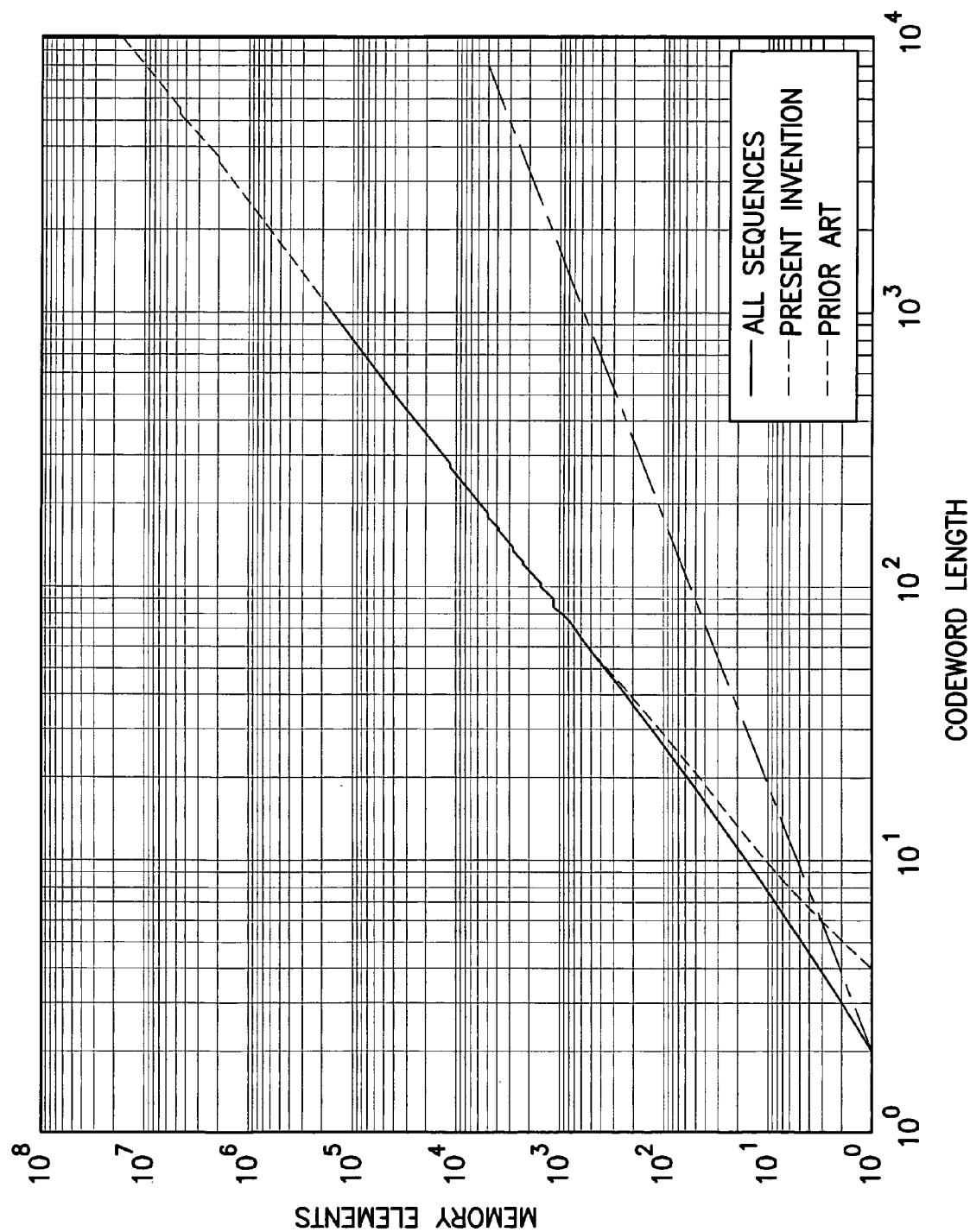
FIG. 6 is a graph comparing memory requirements for the present invention versus the prior art for a LDPC mother code of rate 0.5.

FIG. 6 is a graph comparing memory elements required by the present invention as compared to those required by the prior art approach for puncturing set forth above, using a mother code of rate 0.5 and for various codeword lengths. For all possible code rates, the prior art requires $$\sum_{i=1}^{N-K} i$$

memory elements to store the uncompressed puncturing sequences $S_x$. Embodiments of the present invention detailed above require only (N−K) memory elements 54. Using state of the art codeword lengths ranging from $1\times10^3$ to $1\times10^6$, this memory difference between the two can be several magnitudes of order for long code words.

The present invention is not limited to those examples above wherein the subsets $S_x$ are contiguous. For example, non-contiguous subsets $S_x$ may be chosen and an additional identifier of starting point and either subset length or subset ending point may be stored in addition to the mother code and the maximum rate puncture sequence $S_{N-K}$, perhaps as a lookup table, algorithm, or combination of the two. However, continuous subsets are preferred.

The above description is made more practical in light of the following discussion on the design of specific puncture sequence for use with a given mother code that allows for implementation of all possible effective coding rates. An initial assumption is that the needed $E_b/N_0$ to achieve a particular performance measure is relatively well behaved (i.e., non-random) from one puncture to the next. Using this assumption and a given LDPC mother code, the invention constructs element-by-element the puncture sequence by determining the next variable degree 32 to puncture that requires the least amount of $E_b/N_0$ for the code ensemble, defined by $(\lambda(x), \rho(x), \pi^{(0)}(x))$, to achieve a target bit error rate (BER) where $$\pi^{(0)}(x) = \sum_{j=2}^{d_l} \pi_j^{(0)} x^{j-1}.$$

Thus, this invention is greedy in $E_b/N_0$ when determining the next variable degree 32 to puncture, and the punctured nodes 26 are restricted to conform to this degree sequence.

The present invention may be employed for any discrete communication system employing multiple coding rates using LDPC codes for the error control system. The wide range of code rates allows for more flexibility in the communication system. Some applications that would use this flexibility are future adaptive coding techniques based on LDPC codes that attempt to adjust the code rate according to channel realizations or statistics.

An alternate approach that is within the scope of this invention fixes the $E_b/N_0$ to insure convergence (i.e. $E_b/N_0$ threshold has been met for the ensemble) for a wide range of code rates by determining the next puncture degree 32 using the smallest number of iterations to achieve the target BER. Unlike the first approach that was greedy in $E_b/N_0$, this alternate approach is greedy with respect to complexity (i.e. number of decoder iterations). A second alternative embodiment is based on the asymptotic thresholds of the code ensemble, which is determined by the edge distributions $\lambda(x)$ and $\rho x)$.

A more detailed description of the "greedy in $E_b/N_0$" approach to designing puncture codes follows. It is based upon a Gaussian Approximation of a BER expression to search for the $E_b/N_0$ that meets the target BER using a finite number of decoding iterations given a punctured code ensemble, defined by the set $(\lambda(x), \rho(x), \pi^{(0)}(x))$. Those skilled in the art could readily extrapolate the algorithm to include the alternate approaches based on the asymptotic $E_b/N_0$ thresholds and the approaches greedy in decoding complexity that were suggested above.

Figure 2B:
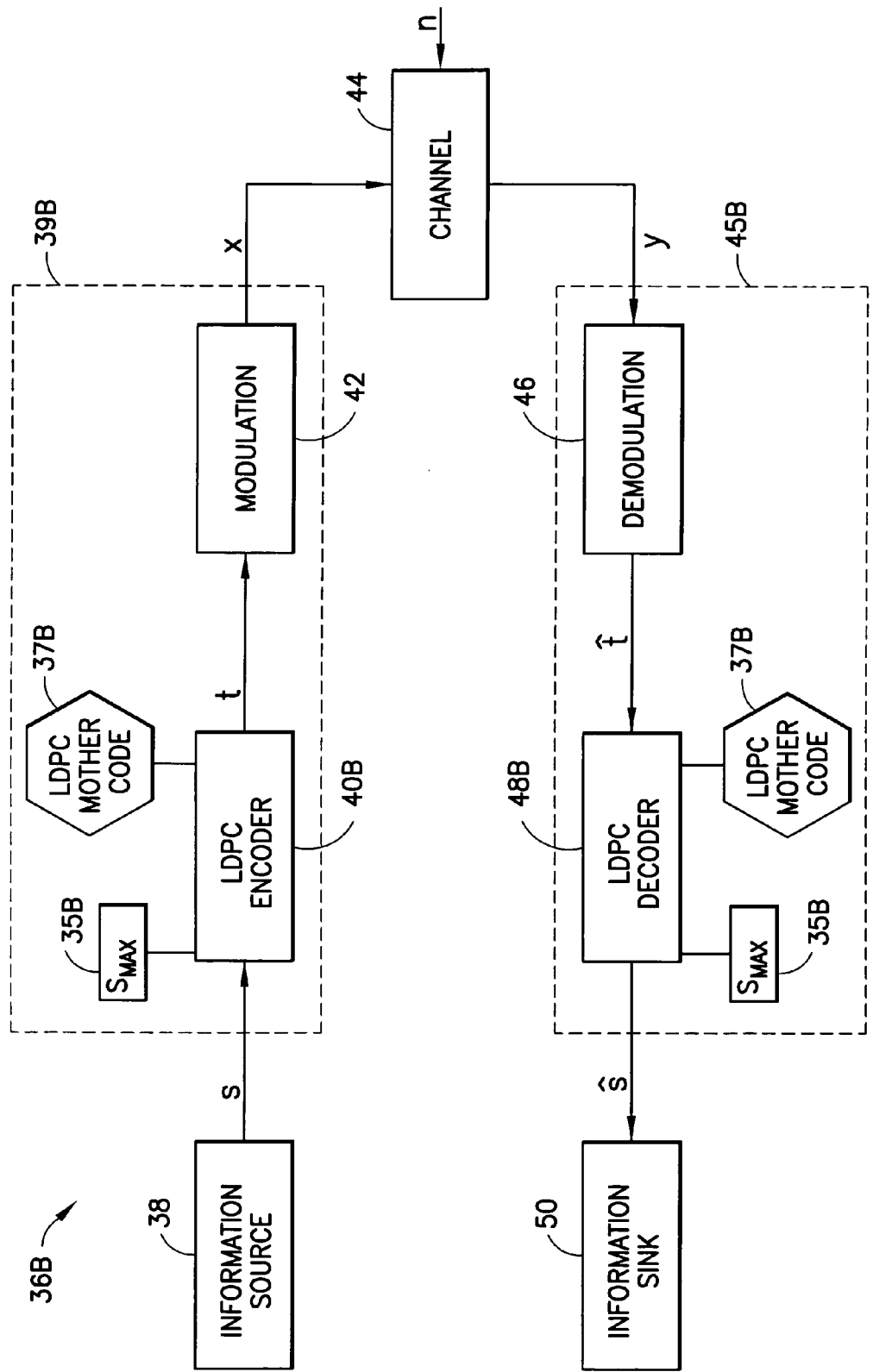
FIG. 2B is a logical block diagram of a communication system according to the present invention.
Figure 3:
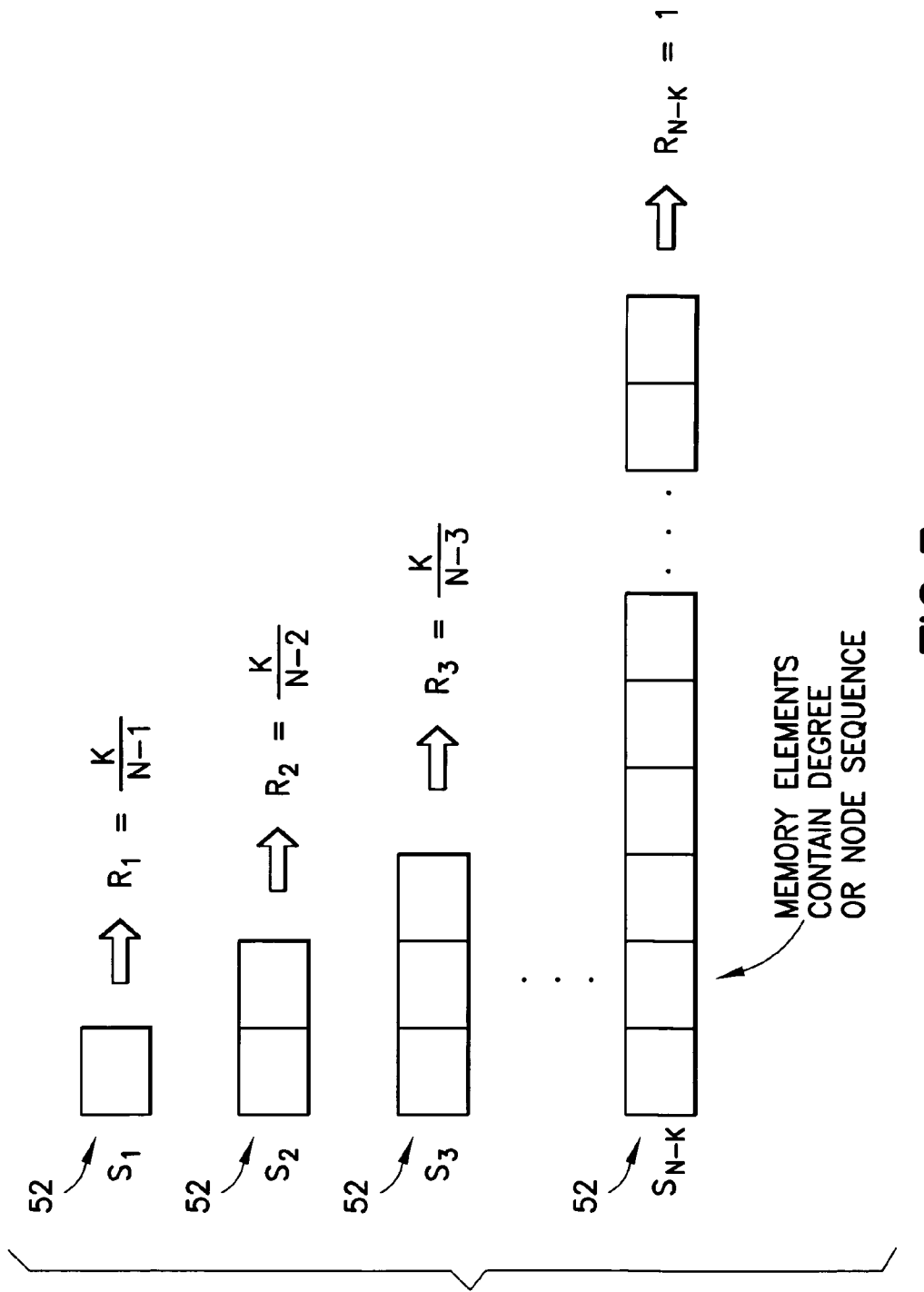
FIG. 3 is a block diagram depiction of puncture sequences for various rates according to the prior art.

Considering again the general discrete communication system 36B of FIG. 2B that uses LDPC coding for its error control, communicating K bits of information per codeword using different code rates by puncturing the code words encoded from a single LDPC mother code of rate K/N where N is the length of the code words.

The following algorithm determines a single variable degree 32 puncturing sequence for an LDPC code. This approach is different than the approaches using Linear Programming (LP) and differential evolution techniques of the prior art. Variable degree subsets from a single puncture sequence, where the subset of the next higher rate contains the subset of the previous lower rate and so forth as described above, are used. For the highest supported code rate $R_{max}=R_{N-K}$, the entire puncture sequence $S_{N-K}$ is then used. This is fundamentally different approach from the prior art and results in a significant reduction of required implementation memory for a large set of code rates derived from a single mother code.

For the AWGN channel, the Gaussian Approximation (GA) technique models the messages sent to the check nodes 28 from the variable nodes 26 as a linear combination of Gaussian random variables. Through empirical study, it has been found that this approximation is fairly accurate for the variable messages sent to the check nodes 28 using an iterative sum-product decoding algorithm, also known as belief propagation. By only tracking the message means, this approximation simplifies the performance analysis over the prior art Density Evolution (DE) previously used to design LDPC code ensembles.

GA BER Expression Based On Message Mean Evolution: The mean value update equation for the $k^{th}$ iteration of a punctured LDPC code ensemble is $$m_u^{(k)} = \sum_{s=2}^{d_r} \rho_s \phi^{-1} \left( 1 - \frac{1}{(1-e(k))^{s-1}} \left[ 1 - \sum_{j=2}^{d_l} \left\{ \lambda_j^{\pi} \sum_{i=0}^{j-1} (j-1) \chi_i^{(k)} \phi(im_u^{(k-1)}) + \lambda_j^{(1-\pi)} \sum_{i=0}^{j-1} (j-1) \chi_i^{(k)} \phi(im_u^{(k-1)} + m_{u_0}) \right\} \right]^{s-1} \right)$$

where $\phi(x)$ and its inverse $\phi^{-1}(y)$ is defined by Sae-Young Chun, "On the Construction of Some Capacity-Approaching Coding Schemes", PhD dissertation, MIT, 2000, herein incorporated by reference. Further parameter descriptions are as described by Jeongseok Ha and Steven W. McLaughlin, "Optimal Puncturing of Irregular Low-Density parity-Check Codes" and "Optimal Puncturing Distributions for Rate-Compatible Low-Density Parity-Check Codes", pre-prints submitted to IEEE ICC 2003, March 2003; and to IEEE Transactions of Information Theory, 2003, respectively, and each incorporated by reference herein. Using the above GA mean update equation, the BER expression after the $k^{th}$ decoding iteration is:

$$P_k = \underbrace{\frac{\sum_{j=2}^{d_l} (\lambda'_j \pi_j^{(0)} (\varepsilon^{(k)})^j)}{2}}_{\text{unrecovered punctured symbols}} + \underbrace{\sum_{j=2}^{d_l} \lambda'_j \pi_j^{(0)} \sum_{i=1}^{j} j \chi_i^{(k)} Q\left(\sqrt{\frac{im_u^{(k)}}{2}}\right)}_{\text{recovered punctured symbols}} + \underbrace{\sum_{j=2}^{d_l} \lambda'_j (1-\pi_j^{(0)}) \sum_{i=0}^{j} j \chi_i^{(k)} Q\left(\sqrt{\frac{im_u^{(k)} + m_{u_0}}{2}}\right)}_{\text{unpunctured symbols}}$$

The "greedy $E_b/N_0$" approach for determining the puncture degree sequence may be summarized as follows. For each available variable degree puncture, calculate the required mean input LLR values, $m_{u_0}$, that achieve the design criteria on the ensemble of codes. Design criteria may include but are not limited to: a target BER within a finite number of iterations using the GA BER expression (greedy in SNR); the asymptotic SNR threshold using DE or GA (greedy in SNR); and the number of decoding iterations for a target BER (greedy in complexity).

Next, select the variable degree, j, within the design criteria for puncturing that required the smallest mean input LLR value (or smallest in decoding complexity) and append the degree to the puncturing sequence. Taking into account a specific code length and the finite number of variable nodes of each degree, adjust the puncturing probability for the punctured variable degree, $\pi_j^{(0)}$. Finally, return to the first iterative step (calculate the required mean input LLR values) and repeat until the puncturing sequence length corresponds to the Binary Erasure Channel (BEC) threshold for random errors (or alternatively until the code rate equals 1.0). Stop the iteration if the fraction of punctured variable nodes 26 reaches or is beyond the BEC threshold. Note that the above algorithm could use a different stopping criterion other than the BEC threshold. Stopping at the BEC threshold corresponds to a transmitted punctured code through a noiseless channel (i.e. very large $E_b/N_0$).

EXAMPLES

Following are examples of various puncturing probabilities for various length LDPC codes realized randomly from the following code ensemble described by the distributions of the variable edges 30 and the check edges 31:

$\lambda_2 = 0.25105 \rho_7 = 0.63676$ $\lambda_3 = 0.30938 \rho_8 = 0.36324$ $\lambda_4 = 0.00104$ $\lambda_{10} = 0.43853$ These edge distributions 30, 31 correspond to a 0.5 code rate where $\{\lambda_2, \lambda_3, \lambda_4, \lambda_{10}\}$ correspond to the fraction of total variable edges 30 connected to variable nodes 26 of degrees $\{2,3,4,10\}$ respectively and $\{\rho_7, \rho_8\}$ correspond to the fraction of total check edges 31 connected to check nodes 28 of degrees $\{7,8\}$ respectively.

Figure 7:
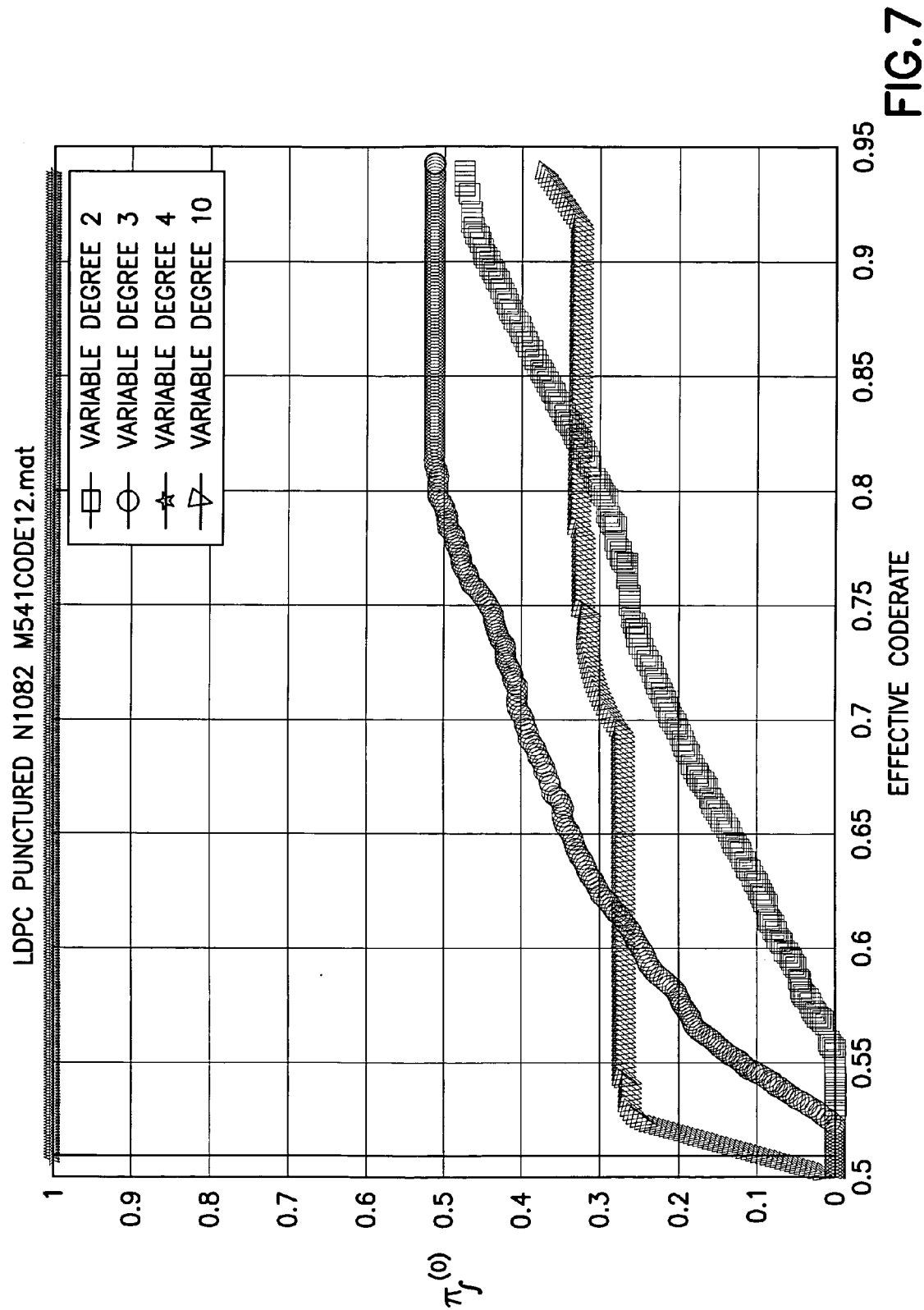
FIG. 7 is a graph showing puncturing probabilities for a codeword of length N=1082 mother code at various code rates.
Figure 8:
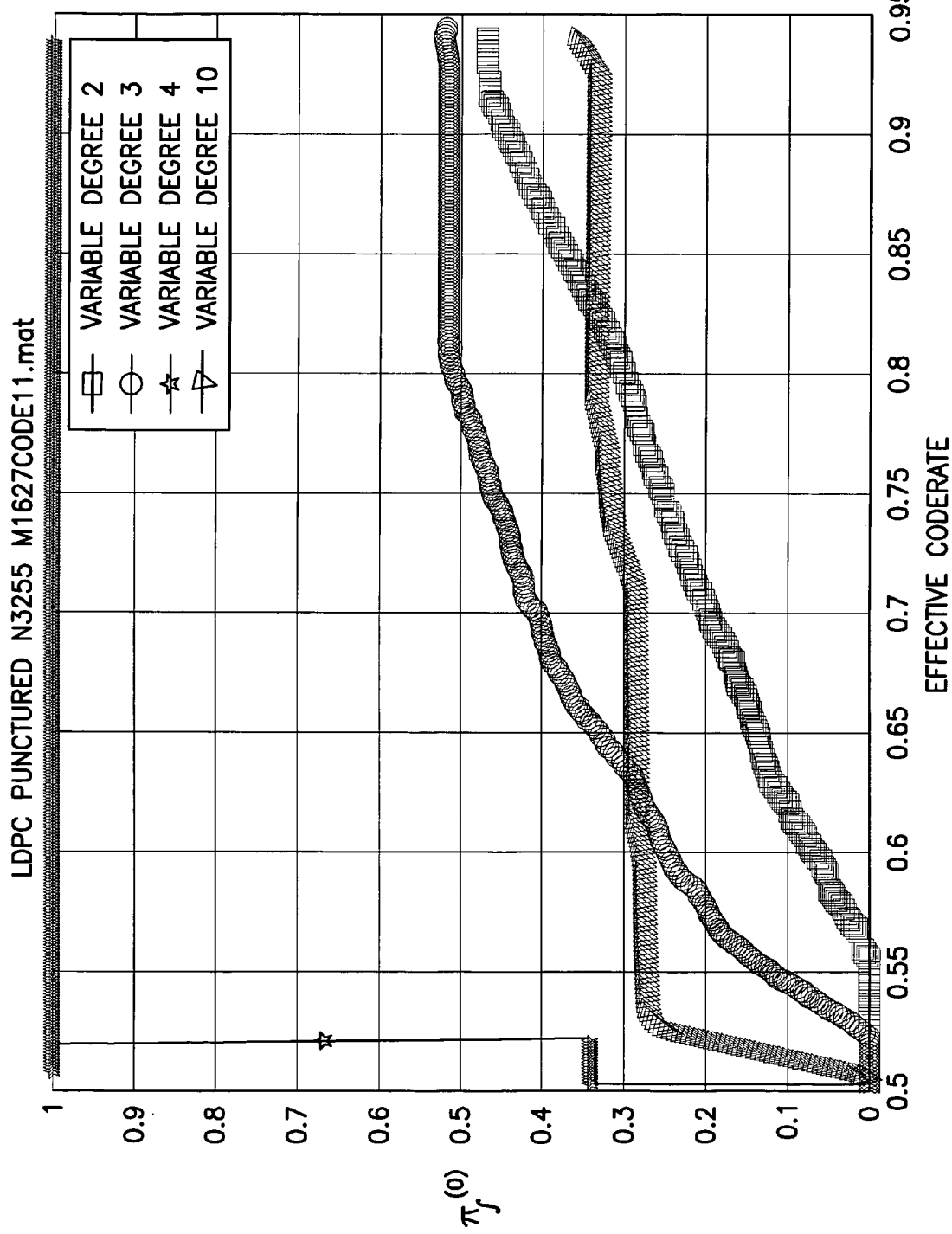
FIG. 8 is a graph similar to FIG. 7 wherein N=3255.

FIG. 7 is a graph illustrating the puncturing probabilities $\{\pi_2^{(0)}, \pi_3^{(0)}, \pi_4^{(0)}, \pi_{10}^{(0)}\}$ (corresponding to the variable degrees of $\{2,3,4,10\}$ respectively) versus the effective code rate for the puncturing sequence derived from the greedy algorithm based on a target BER within a finite number of iterations using the GA BER expression (presented above) of a length N=1082 LDPC code. Similarly, FIG. 8 is a graph illustrating the puncturing probabilities for the puncturing degree sequence of a length N=3255 LDPC code. For both puncturing degree sequences, the asymptotic $E_b/N_0$ threshold in dB is plotted versus the effective code rate in FIGS. 12 and 16 respectively.

Because for each code realization, the beginning subset of a single puncturing degree sequence is used (thus encapsulating the previous subsets of the lower rate codes), the puncturing probabilities are monotonically increasing. Note that the degree sequence is specified by these graphs and not the actual node sequence. The actual variable node 26 puncture sequence has many permutations within a specified degree 32 sequence, so it still may be possible to optimize (for some desired design criterion) the node 26 sequence further within the degree 32 sequence. For the work herein described, the node 26 sequence was chosen as the first available in the subset of nodes 26 corresponding to the punctured degree 32.

Present in both N=1082 and N=3255 examples are large jumps in discontinuities for the puncturing probability of variable nodes 26 of degree 4. Such discontinuities are similar to those present in the prior art. They exist because $\lambda_4$ is relatively small with respect to $\{\lambda_2, \lambda_3, \lambda_{10}\}$, resulting in very few variable nodes 26 of degree 4. For codeword length N=1082, there is only one variable node 26 of degree 4, and for N =3255, there are only three variable nodes 26 of degree 4. Furthermore, these large steps in the puncture probability highlight the discrete nature of the problem for LDPC code realizations of practical codeword lengths not addressed by prior art approaches.

Results:

FIGS. 9–16 are graphs illustrating results for BPSK/AWGN Monte-Carlo simulations of the puncturing degree sequences illustrated in FIGS. 7 and 8, and constructed in the greedy approach described above. In constructing the two puncturing sequences for each mother code respectively (degree sequences in FIGS. 7 and 8), the target BER of $1 \times 10^{-6}$ for fifty iterations of the code ensemble was used as the design criterion in the greedy algorithm outlined above.

Figure 9:
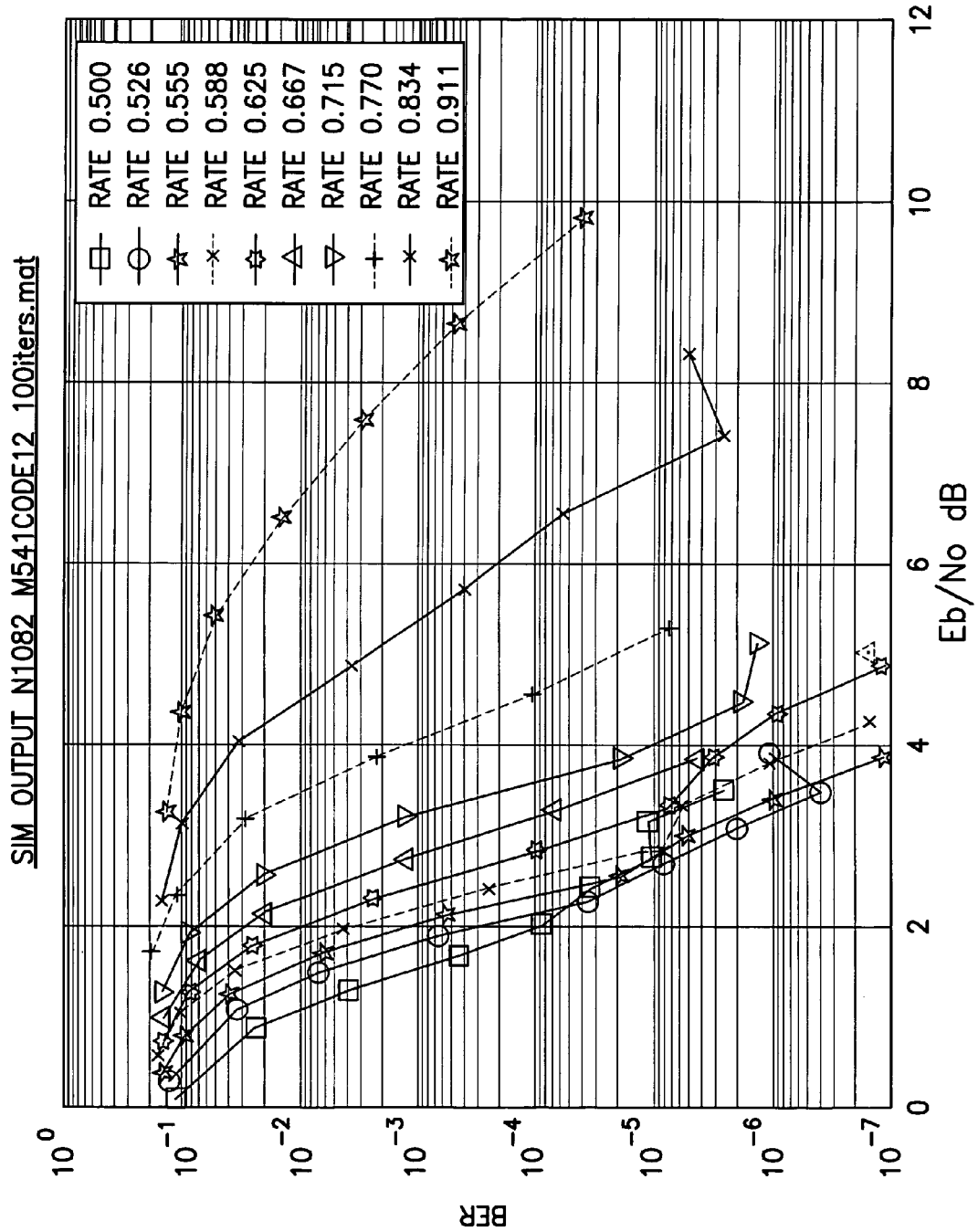
FIG. 9 is a graph showing Bit Error Rate performance for a mother code of length N=1082.
Figure 10:
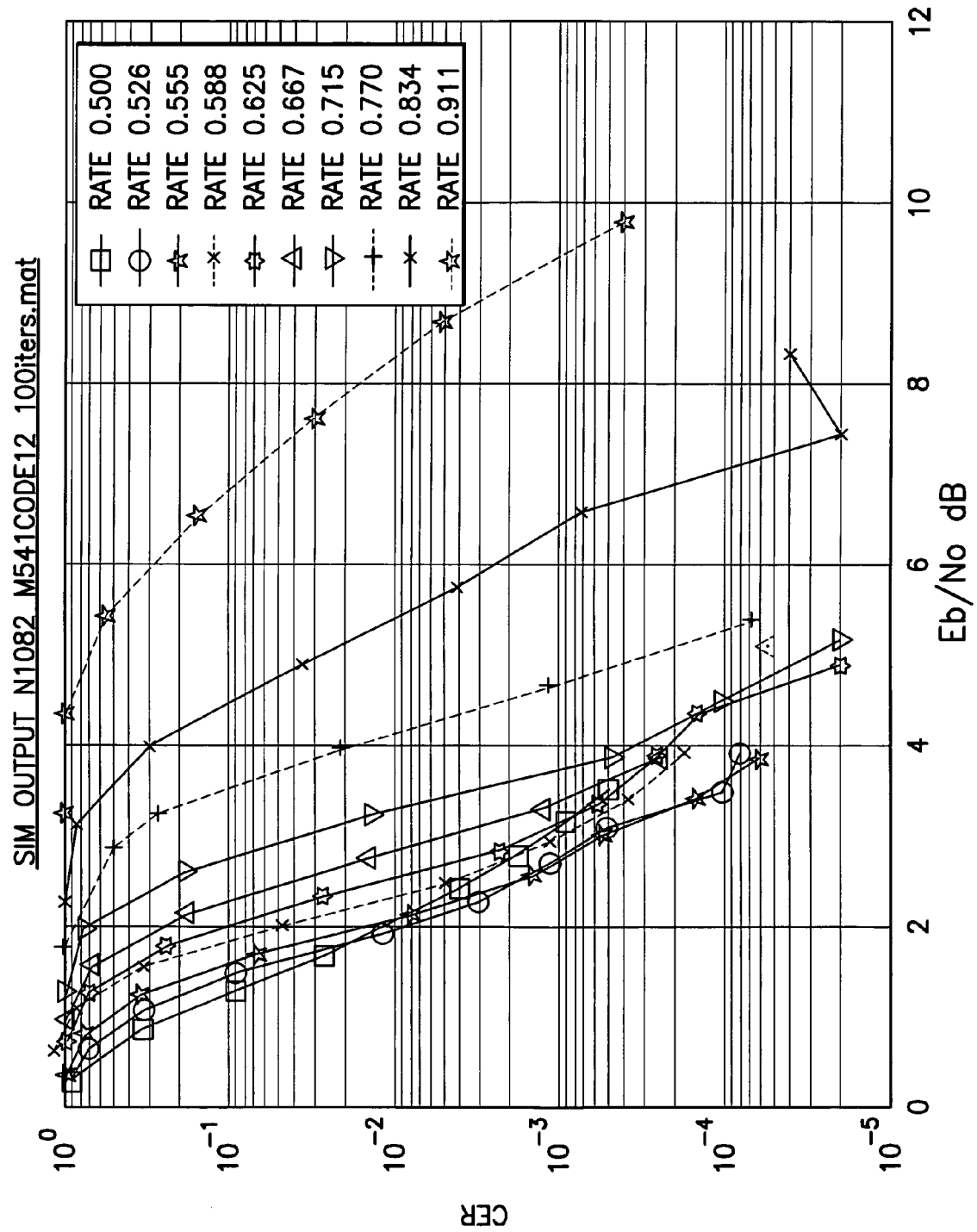
FIG. 10 is a graph similar to FIG. 9 but showing Codeword Error rate performance.
Figure 13:
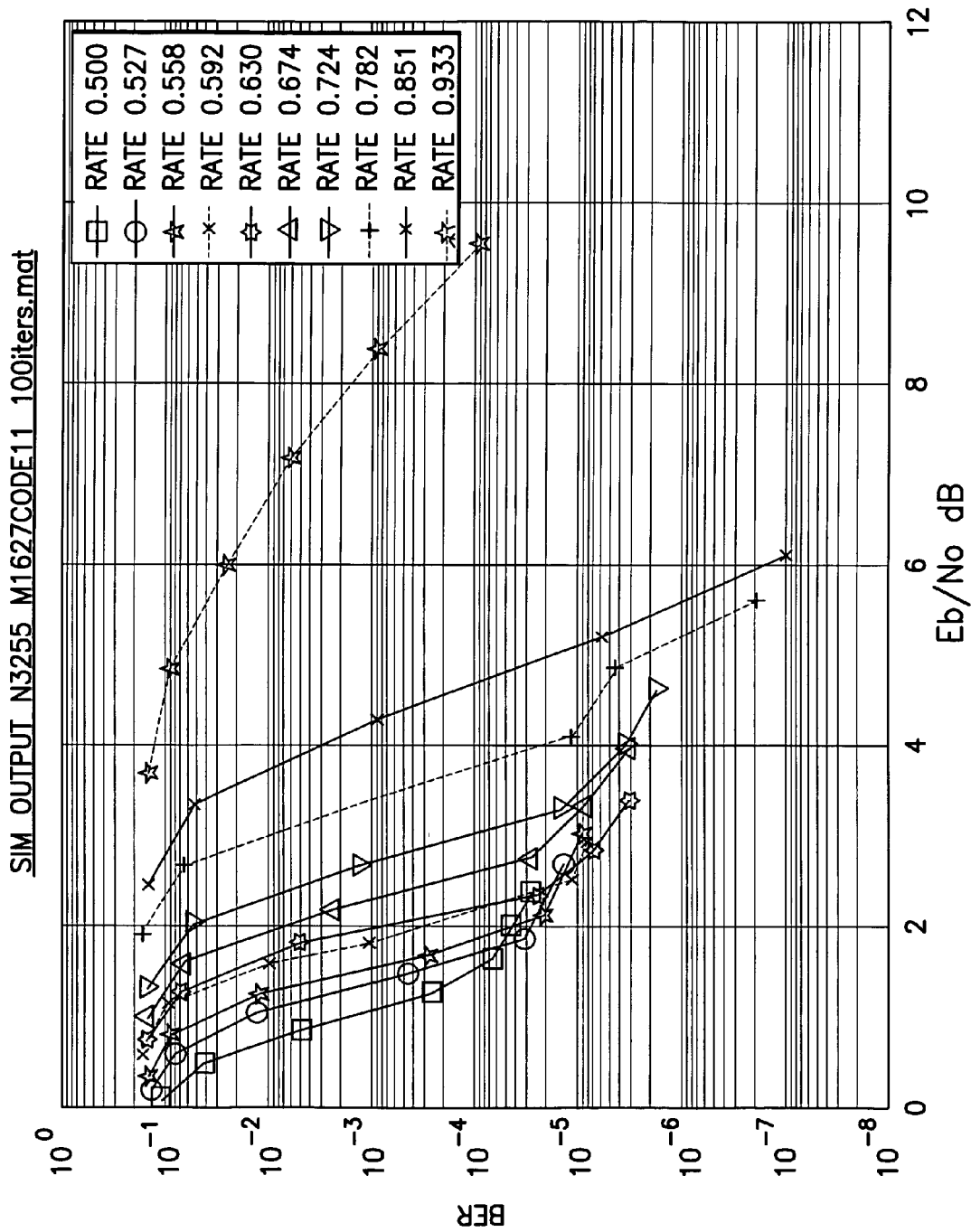
FIG. 13 is a graph similar to FIG. 9 for N=3255.
Figure 14:
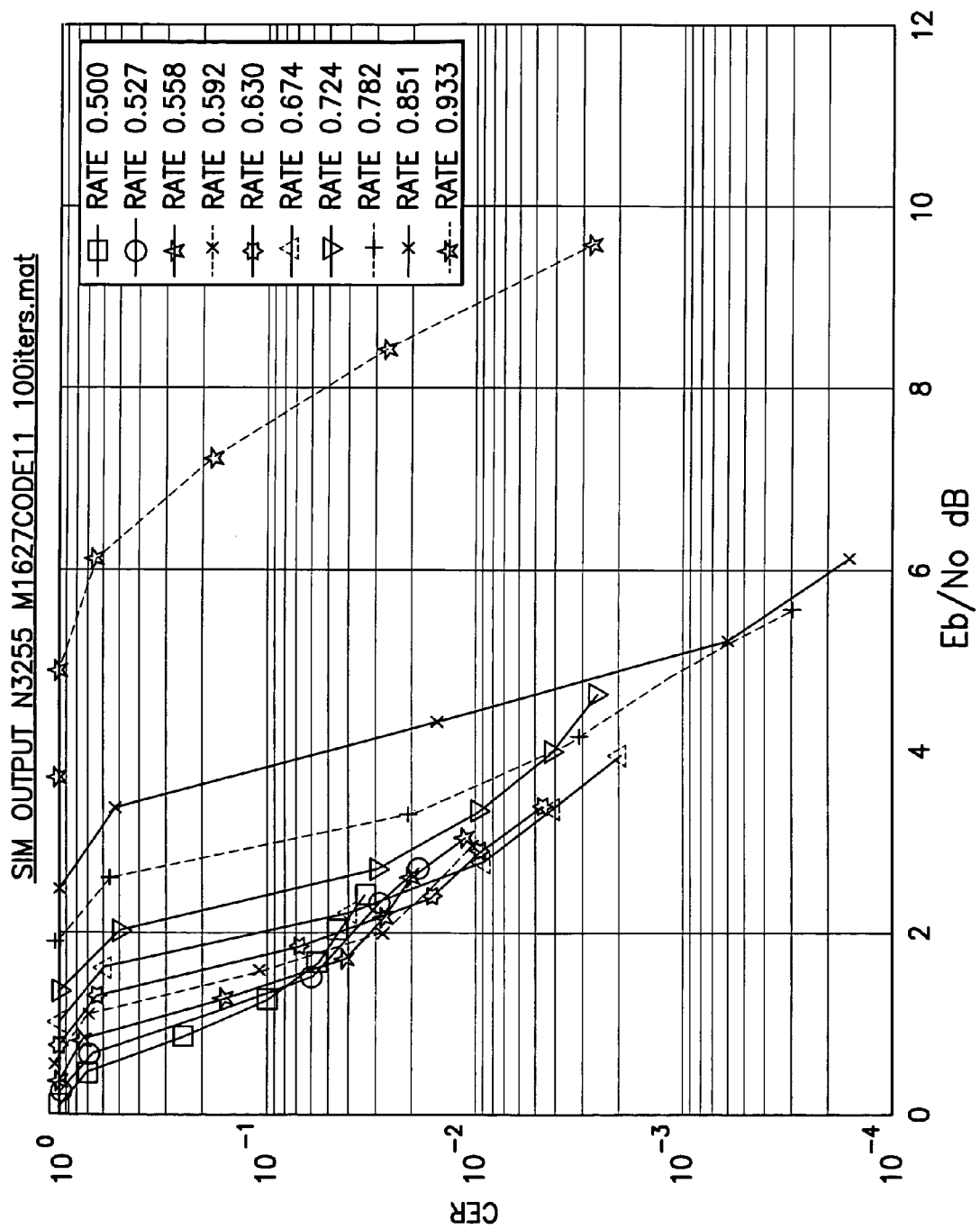
FIG. 14 is a graph similar to FIG. 10 for N=3255.

FIGS. 9 and 13 are Bit-Error-Rate (BER) versus $E_b/N_0$ dB simulation results for punctured LDPC mother codes of lengths 1082 and 3255 respectively using 100 decoder iterations. The simulations ran until the earlier of 300 codeword errors or until 50,000 code words. FIGS. 10 and 14 are Codeword-Error-Rate (CER) versus $E_b/N_0$ dB simulation results for punctured LDPC mother codes of lengths 1082 and 3255, respectively, using 100 decoder iterations.

Figure 11:
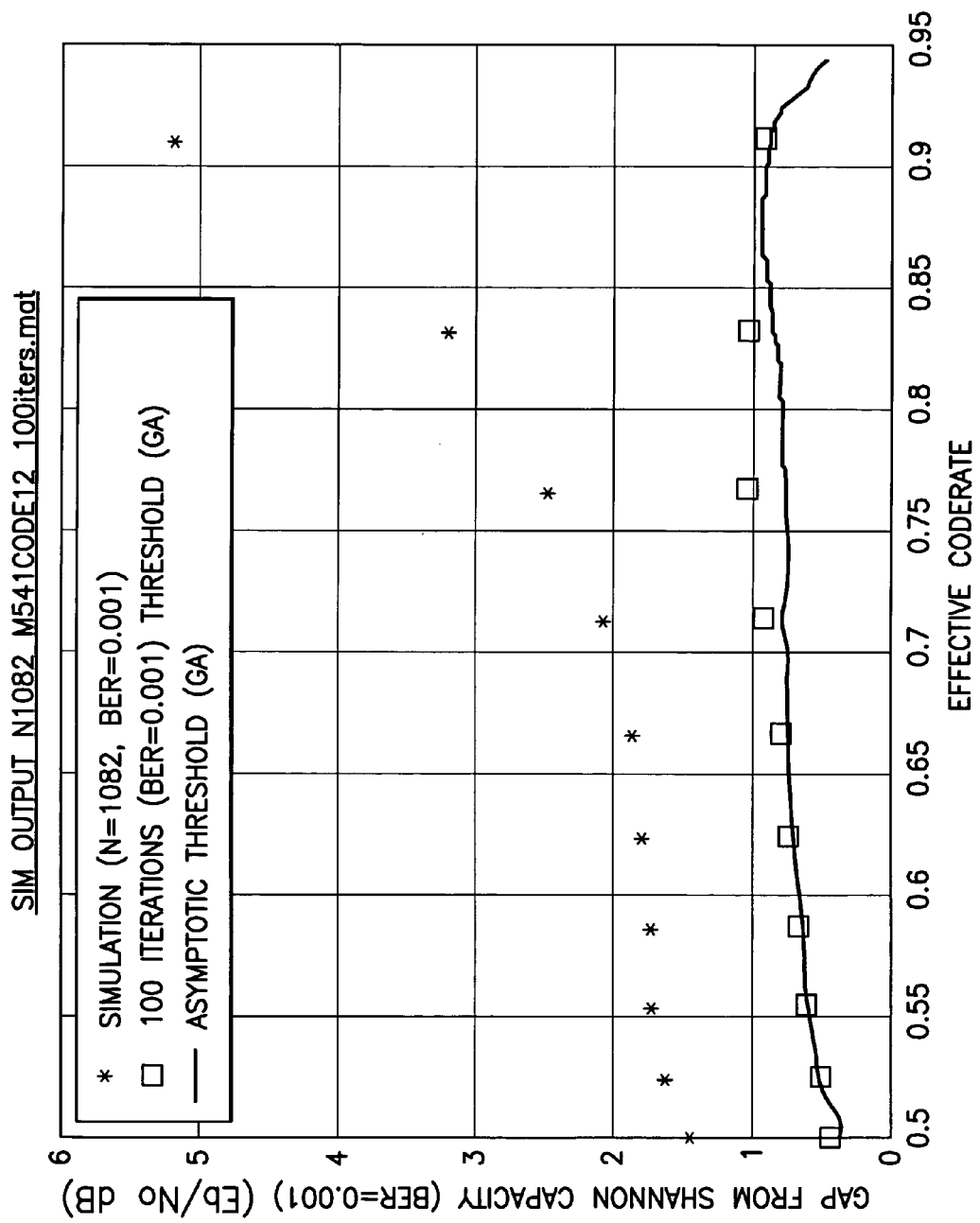
FIG. 11 is a graph showing $E_b/N_0$ gap from the Shannon Limit for BER=1×10$^{-3}$ and N=1082.
Figure 12:
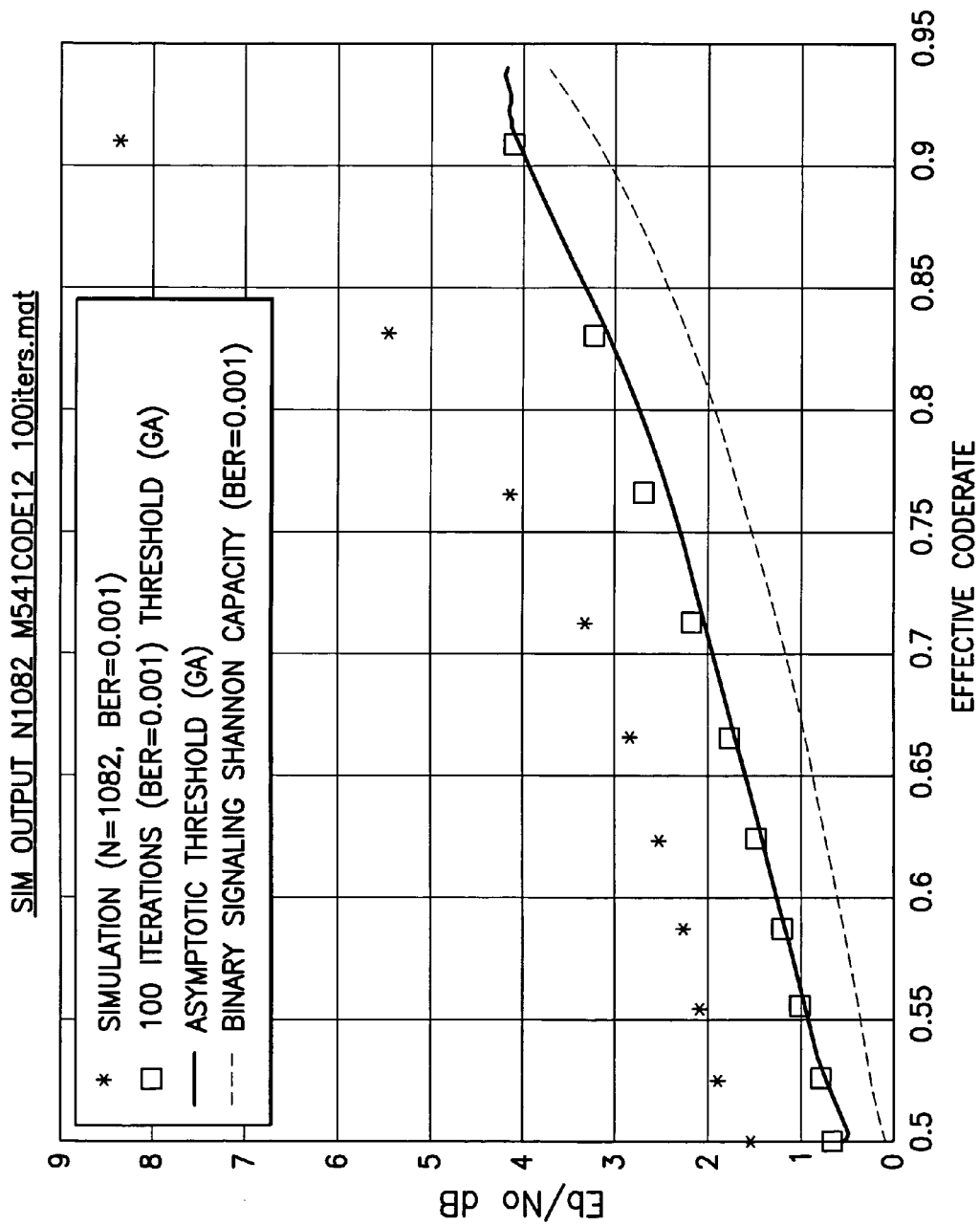
FIG. 12 is a graph showing required $E_b/N_0$ ratio to achieve BER=1×10$^{-3}$ for N=1082.
Figure 15:
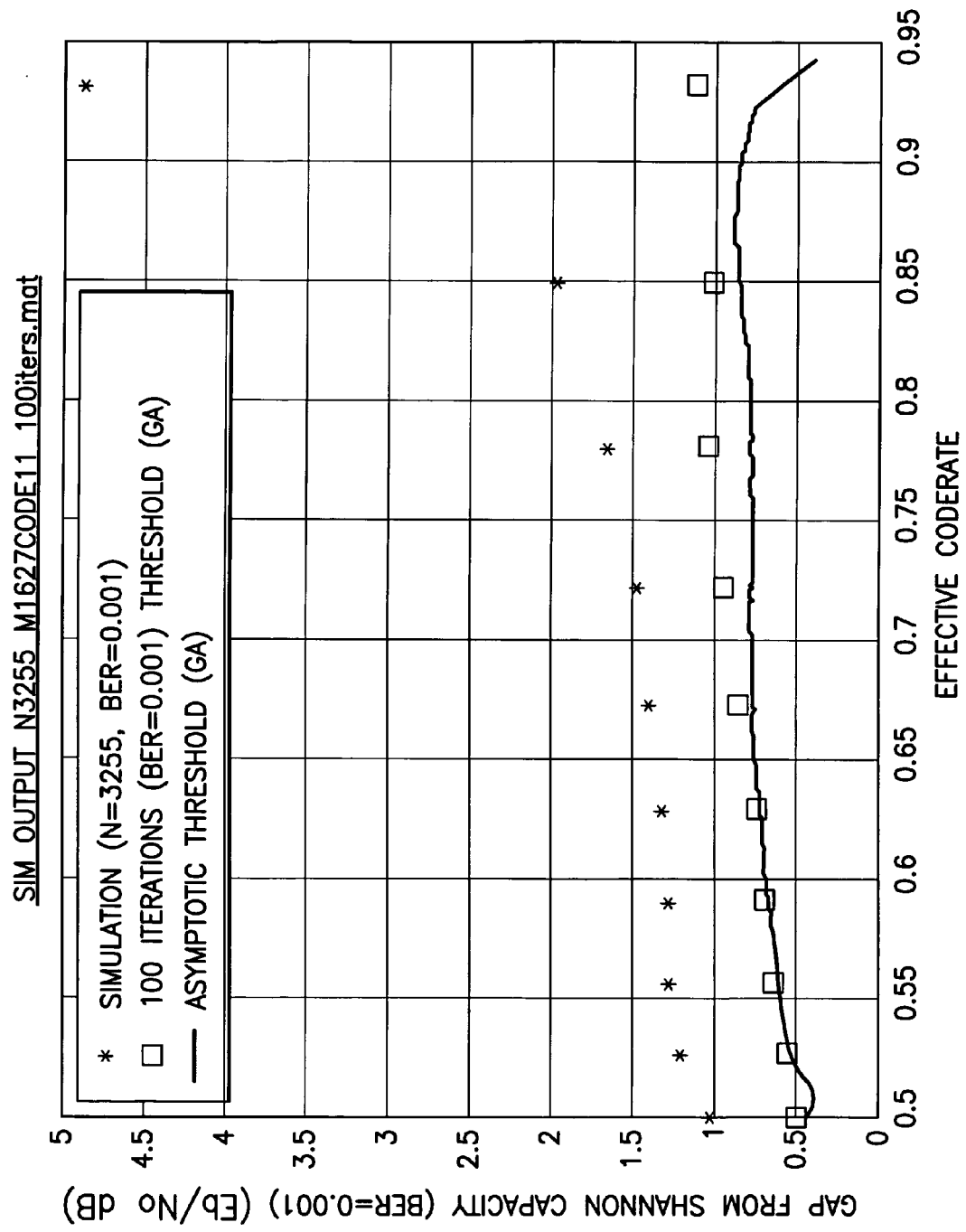
FIG. 15 is a graph similar to FIG. 11 for N=3255.
Figure 16:
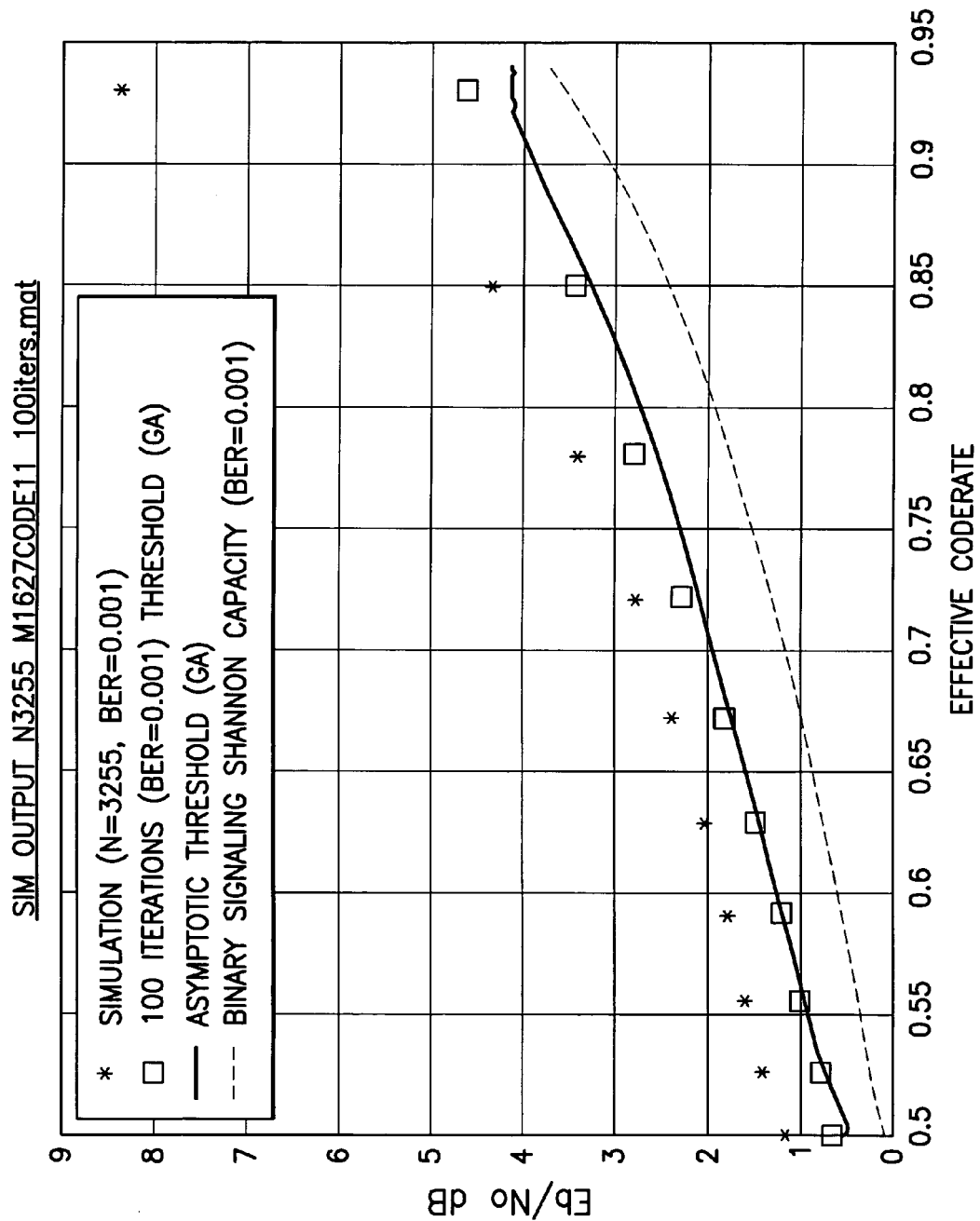
FIG. 16 is a graph similar to FIG. 12 for N=3255.

FIGS. 11 and 15 plot the SNR gap with respect to the binary signaling Shannon capacity limit at BER=$1 \times 10^{-3}$ of the punctured LDPC code performance using 100 iterations and mother code lengths of 1082 and 3255 respectively. It can be seen that for a wide range of code rates the punctured code's performance measured by the SNR gap remains fairly constant, within 0.5 dB for code rates up to around 0.7 for codeword length 1082 and up to code rates up to 0.75 for codeword lengths 3255. Thus for longer codeword lengths, the punctured code performs better. Such is normally true for LDPC codes employing belief propagation decoding, because of the independence assumption concerning the passed messages. For shorter length codes, messages become correlated relatively faster than messages of longer length codes (assuming for both that the parity check matrix is properly designed to eliminate short cycles). FIGS. 12 and 16 plot the SNR corresponding to BER=$1 \times 10^{-3}$ of the punctures LDPC mother codes of lengths 1082 and 3255 respectively along with the binary Shannon capacity limit also at BER=$1 \times 10^{-3}$.

While there has been illustrated and described what is at present considered to be a preferred embodiment of the claimed invention, it will be appreciated that numerous changes and modifications are likely to occur to those skilled in the art. It is intended in the appended claims to cover all those changes and modifications that fall within the spirit and scope of the claimed invention.

What is claimed is:

1. A communication unit for a multiple code rate communication system comprising:
   a codeword defining N codeword elements and K information elements coded at a code rate R=K/(N−P), wherein P is a number of punctured elements of the codeword;
   a first storage location for storing an error reduction code mother code definition;
   a second storage location for storing a maximum puncture sequence $S_{max}$, wherein the maximum puncture sequence $S_{max}$ is stored in and retrieved from a plurality of memory elements, wherein $S_{max}$ is the puncture sequence for a maximum code rate $R_{max}$, and further wherein $S_{max}$ comprises a minimum puncture sequence $S_1$ that is a puncture sequence for a minimum code rate $R_1$, wherein the minimum puncture sequence $S_1$ is stored in and retrieved from a subset of the plurality of memory elements that store the maximum puncture sequence $S_{max}$, wherein the codeword is one of decoded or encoded through the error reduction code mother code definition read from the first storage location and a selected one of puncturing sequences $S_1$, $S_2, \ldots S_{max}$ read from the second storage location wherein the sequence $S_2$ is stored in and retrieved from a subset of the plurality of memory elements that store the maximum puncture sequence $S_{max}$.

2. The communication unit of claim 1 wherein the unit is one of a transmitter that outputs the codeword or a receiver that receives the codeword.

3. The communication unit of claim 1 wherein $S_{max} = S_{N-K}$.

4. The communication unit of claim 1 wherein the second storage location comprises a plurality of memory elements for storing the maximum puncture sequence $S_{max}$, each memory element storing a variable degree.

5. The communication unit of claim 1 wherein the second storage location comprises a plurality of memory elements for storing the maximum puncture sequence $S_{max}$, each memory element storing a variable node location.

6. The communication unit of claim 1 wherein the second storage location comprises a plurality of memory elements for storing the maximum puncture sequence $S_{max}$, each memory element storing one of a variable degree, a check degree, a variable node location, or a check node location.

7. The communication unit of claim 1 wherein the error reduction code mother code is a low-density parity-check (LDPC) mother code.

8. The communication unit of claim 1 wherein the maximum puncture sequence $S_{max}$ further comprises at least two sequences $S_i$ that are puncture sequences for code rates $R_i$, wherein i is an integer greater than or equal to one and each sequentially higher $i^{th}$ code rate is higher than the sequentially lower $i^{th}$ code rate, wherein each of the sequences $S_i$ is stored in a unique subset of the plurality of memory elements that store the maximum puncture sequence $S_{max}$.

9. The communication unit of claim 8 wherein each sequence $S_i$ is stored in at least one memory element, and each sequence $S_i$ with at least two memory elements has at least one memory element in common with another sequence $S_i$ and with the maximum puncture sequence $S_{max}$, wherein each of the sequences $S_i$ is stored in a unique subset of the plurality of memory elements that store the maximum puncture sequence $S_{max}$.

10. The communication unit of claim 8 wherein $S_1 \subseteq S_2 \subseteq \ldots \subseteq S_{max-1} \subseteq S_{max}$.

11. The communication unit of claim 8 wherein each sequence $S_i$ comprises at least one memory element, and there is at least one sequence $S_i$ that has no memory elements in common with another sequence $S_i$.

12. The communication unit of claim 8, wherein the sequence $S_i$ corresponds to a puncture sequence representing non-zero element locations in a column of a parity check matrix.

13. The communication unit of claim 8, wherein the sequence $S_i$ corresponds to a puncture sequence representing a number of non-zero elements in a column of a parity check matrix.

14. The communication unit of claim 8, wherein different combinations of columns of a check parity matrix correspond to different sequences $S_i$ and all columns of the parity check matrix correspond to the maximum puncture sequence $S_{max}$.

15. A transceiver for transmitting and receiving a codeword at any of three coding rates $R_1$, $R_2$ and $R_3$, wherein the codeword defines N codeword elements, K information elements, and P punctured elements, and the coding rates $R_1=K/(N-P_1)<R_2=K/(N-P_2)<R_3=K/(N-P_3)$, comprising:
- a transmitter, a receiver, and storage for storing a low-density parity-check (LDPC) mother code definition;
- a plurality of memory elements that in combination store a puncture sequence $S_3$ that corresponds to $R_3$;
- a first set of computer instructions for retrieving a first subset of the plurality of memory elements to yield a puncture sequence $S_1$ that corresponds to $R_1$; and
- a second set of computer instructions for retrieving a second subset of the plurality of memory elements to yield a puncture sequence $S_2$ that corresponds to $R_2$.

16. A computer program embodied on a computer readable medium for determining a puncture sequence for a codeword, comprising:
- a first storage location for storing a low-density parity-check (LDPC) mother code definition;
- a second storage location for storing a plurality of memory elements $M_{all}$ that in combination comprise a maximum rate puncture sequence $S_{max}$, that corresponds to a maximum code rate $R_{max}$; and
- a first set of computer instructions for reading a first subset of memory elements $M_{set1}$, wherein the number of $M_{set1}$ is less than the number of $M_{all}$, wherein $M_{set1}$ comprises a puncturing sequence $S_1$ that corresponds to a code rate $R_1<R_{max}$.

17. The computer program of claim 16 further comprising a second set of computer instructions for reading a second subset of memory elements $M_{set2}$, wherein the number of $M_{set2}$ is greater than the number of $M_{set1}$, wherein $M_{set2}$ comprises a puncturing sequence $S_2$ that corresponds to a code rate $R_2>R_1$, and further wherein at least one memory element is a memory element of both $M_{set1}$ and $M_{set2}$.

18. A method for determining a puncture sequence for an ensemble of low-density parity-check (LDPC) codes comprising:
- selecting at least one design criteria for an ensemble of LDPC codes and a stop criteria;
- calculating a mean input LLR values, $m_{u_0}$, that achieves the design criteria on the ensemble of codes;
- selecting a variable degree j within the design criteria for puncturing that requires one of a smallest mean input LLR value or a smallest decoding complexity;
- appending the variable degree to the puncturing sequence;
- adjusting the puncturing probability for the punctured variable degree, $\pi_j^{(0)}$; and
- repeating the calculating and subsequent steps until the stop criteria is reached.

19. The method of claim 18 wherein adjusting the puncturing probability for the punctured variable degree, $\pi_j^{(0)}$ includes accounting for a specific code length and a finite number of variable nodes of each variable degree.

20. The method of claim 18 wherein the stop criteria comprises a code rate equal to one.

21. The method of claim 18 wherein the stop criteria comprises a length of a puncturing sequence that corresponds to a Binary Erasure Channel (BEC) threshold for random errors.

22. The method of claim 21 wherein the stop criteria comprises a fraction of punctured variable nodes that reaches or exceeds the BEC threshold.

23. The method of claim 18 wherein the at least one design criteria is selected from at least one of the group consisting of: a target bit error rate (BER) within a finite number of iterations; an asymptotic $E_b/N_0$ threshold; and a number of decoding iterations for a target BER.

24. A transmitter comprising:
- an information source for providing a codeword;
- a memory for storing a low density parity check code LDPC mother code definition and a maximum puncture sequence $S_{max}$;
- a LDPC encoder having an input coupled to an output of the information source and an input coupled to an output of the memory; and
- a modulator having an input coupled to an output of the LDPC encoder, wherein the encoder operates in one instance to encode at a maximum rate $R_{max}$ by puncturing at least one elements of a codeword described by the maximum puncture sequence $S_{max}$ read from the memory, and in another instance to encode at a lesser rate $R_1$ by puncturing elements of a codeword described by a sequence $S_1$ of the maximum puncture sequence $S_{max}$ read from the memory, wherein the maximum puncture sequence $S_{max}$ is stored in and retrieved a plurality of memory elements and the subset $S_1$ is retrieved from a portion of the plurality of memory elements.

25. The transmitter of claim 24, wherein the encoder encodes at any of rates $R_{max}$, $R_3$, $R_2$, and $R_1$ by puncturing elements of a codeword in locations described by the respective sequences $S_{max}$, $S_3$, $S_2$, and $S_1$, wherein $R_{max}<R_3<R_2<R_1$ and $S_1 \subseteq S_2 \subseteq S_3 \subseteq S_{max}$.

26. The transmitter of claim 24, wherein the encoder encodes at any of rates $R_{max}$, $R_3$, $R_2$, and $R_1$ by puncturing elements of a codeword in locations described by the respective sequences $S_{max}$, $S_3$, $S_2$, and $S_1$, wherein $R_{max}<R_3<R_2<R_1$ and each of the sequences $S_1$, $S_2$ and $S_3$ are subsets of $S_{max}$ but not subsets of any of the other of the sequences $S_1$, $S_2$ and $S_3$.

27. A receiver comprising:
- a demodulator for demodulating a received codeword;
- a memory for storing a low density parity check code LDPC mother code definition and a maximum puncture sequence $S_{max}$; and
- a LDPC decoder having an input coupled to an output of the demodulator and an input coupled to an output of the memory;

wherein the decoder operates in one instance to decode at a maximum rate $R_{max}$ by de-puncturing elements of a codeword described by the maximum puncture sequence $S_{max}$ read from the memory, and in another instance to decode at a lesser rate $R_1$ by de-puncturing at least one elements of a codeword described by a sequence $S_1$ of the maximum puncture sequence $S_{max}$ read from the memory, wherein the maximum puncture sequence $S_{max}$ is stored in and retrieved from a plurality of memory elements, wherein the sequence $S_1$ is retrieved from fewer than all of the memory elements of the plurality of memory elements.

28. The receiver of claim 27, wherein the decoder decodes at any of rates $R_{max}$, $R_3$, $R_2$, and $R_1$ by de-puncturing elements of a codeword in locations described by the respective sequences $S_{max}$, $S_3$, $S_2$, and $S_1$, wherein $R_{max}<R_3<R_2<R_1$ and $S_1 \subseteq S_2 \subseteq S_3 \subseteq S_{max}$, wherein the sequences $S_2$, and $S_3$ are retrieved from fewer than all of the memory elements of the plurality of memory elements.

29. The receiver of claim 27, wherein the decoder decodes at any of rates $R_{max}$, $R_3$, $R_2$, and $R_1$ by de-puncturing elements of a codeword in locations described by the respective sequences $S_{max}$, $S_3$, $S_2$, and $S_1$, wherein $R_{max}<R_3<R_2<R_1$ and each of sequences $S_1$, $S_2$ and $S_3$ are subsets of $S_{max}$ but not subsets of any of the other of sequences $S_1$, $S_2$ and $S_3$, wherein the sequences $S_2$ and $S_3$ are retrieved from fewer than all of the memory elements of the plurality of memory elements.

30. A method for operating a communication unit at multiple code rates comprising:
receiving a codeword defining N codeword elements and K information elements coded at a code rate R=K/(N−P), wherein P is a number of punctured elements of the codeword;
retrieving an error reduction code mother code definition from a first storage location;
retrieving a puncture sequence from a second storage location, wherein the puncture sequence retrieved from the second storage location is a selected one of a maximum puncture sequence $S_{max}$ for a maximum code rate $S_{max}$ and a minimum puncture sequence $S_1$ for a minimum code rate $R_1$ and the minimum puncture sequence $S_1$ is a subset of $S_{max}$ and the minimum puncture sequence $S_1$ corresponds to a column of a parity check matrix, wherein the maximum puncture sequence is stored in and retrieved from a combination of memory elements and the minimum puncture sequence $S_1$ is stored in and retrieved from a subset of the combination of memory elements.

31. A circuit, comprising:
a plurality of memory elements adapted to store a puncture sequence $S_{max}$, the puncture sequence $S_{max}$ corresponding to a maximum code rate $R_{max}$, the puncture sequence $S_{max}$ being stored in a memory, a puncture sequence $S_1$ being retrieved from a subset of the plurality of memory elements adapted to store the puncture sequence $S_{max}$, the puncture sequence $S_1$ corresponding to a code rate $R_1$ that is less than the maximum code rate $R_{max}$; and
circuitry adapted to perform one of encoding and decoding a codeword defining N codeword elements and K information elements coded at a code rate R=K/(N−P), where P is a number of punctured elements of the codeword and the code rate R includes the code rates $R_{max}$ and $R_1$.

32. A circuit according to claim 31, wherein the subset of the plurality of memory elements adapted to store the puncture sequence $S_1$ are contiguous memory elements.

33. A circuit according to claim 31, wherein the circuitry in one instance decodes the codeword at a maximum rate $R_{max}$ by de-puncturing at least one codeword element according to the maximum puncture sequence $S_{max}$ read from the plurality of memory elements, and in another instance decodes the codeword at a lesser rate $R_1$ by de-puncturing at least one codeword element according to the sequence $S_1$ read from the subset of the plurality of memory elements.

34. A circuit according to claim 31, wherein the circuitry operates in one instance encodes the codeword at a maximum rate $R_{max}$ by puncturing at least one codeword element according to the maximum puncture sequence $S_{max}$ read from the plurality of memory elements, and in another instance encodes the codeword at a lesser rate $R_1$ by puncturing at least one codeword element according to the sequence $S_1$ read from the subset of the plurality of memory elements.

35. A circuit according to claim 31, further comprising a puncture sequence $S_2$ being retrieved from another subset of the plurality of memory elements, the puncture sequence $S_2$ corresponding to a code rate $R_2$ that is less than the maximum code rate $R_{max}$.

36. A circuit according to claim 35, wherein the subset of the plurality of memory elements adapted to store the puncture sequence $S_2$ has no memory elements in common with the subset of the plurality of memory elements adapted to store the puncture sequence $S_1$.

37. A circuit according to claim 35, wherein the code rate $R_2$ is different from code rate $R_1$.

38. A circuit according to claim 35, wherein the code rate $R_2$ is greater than code rate $R_1$.

* * * * *